(12) United States Patent
Onodera et al.

(10) Patent No.: US 8,614,142 B2
(45) Date of Patent: Dec. 24, 2013

(54) LAMINATED STRUCTURE, MULTILAYER WIRING BOARD, ACTIVE MATRIX SUBSTRATE, IMAGE DISPLAY APPARATUS, AND METHOD FOR MANUFACTURING LAMINATED STRUCTURE

(75) Inventors: Atsushi Onodera, Tokyo (JP); Hidenori Tomono, Kanagawa (JP); Koei Suzuki, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 330 days.

(21) Appl. No.: 13/039,708

(22) Filed: Mar. 3, 2011

(65) Prior Publication Data
US 2011/0215336 A1 Sep. 8, 2011

(30) Foreign Application Priority Data
Mar. 4, 2010 (JP) ................................ 2010-048127

(51) Int. Cl.
*H01L 21/3205* (2006.01)
*H01L 21/84* (2006.01)

(52) U.S. Cl.
USPC ............................ 438/585; 438/149; 438/674

(58) Field of Classification Search
USPC .................. 438/149, 585, 674; 257/E21.159, 257/E21.174, E29.273
See application file for complete search history.

(56) References Cited

U.S. PATENT DOCUMENTS

| | | | |
|---|---|---|---|
| 5,100,691 A * | 3/1992 | Tokunaga et al. ................ 117/95 |
| 6,734,029 B2 * | 5/2004 | Furusawa .......................... 438/22 |
| 7,612,455 B2 | 11/2009 | Tano et al. | |
| 7,816,672 B2 * | 10/2010 | Tomono et al. .................. 257/40 |
| 2004/0238816 A1 * | 12/2004 | Tano et al. ....................... 257/40 |
| 2008/0029766 A1 | 2/2008 | Onodera et al. | |
| 2009/0071701 A1 | 3/2009 | Onodera et al. | |
| 2009/0095958 A1 | 4/2009 | Inoue et al. | |
| 2009/0103036 A1 | 4/2009 | Onodera et al. | |
| 2009/0278138 A1 | 11/2009 | Suzuki et al. | |
| 2009/0321727 A1 | 12/2009 | Yutani et al. | |
| 2010/0078642 A1 | 4/2010 | Tano et al. | |
| 2010/0181571 A1 | 7/2010 | Tano et al. | |

FOREIGN PATENT DOCUMENTS

JP 2004-109209 4/2004
JP 2005-310962 11/2005

* cited by examiner

*Primary Examiner* — Hung Vu
(74) *Attorney, Agent, or Firm* — Cooper & Dunham LLP

(57) ABSTRACT

A method for manufacturing a laminated structure includes a step of supplying a droplet of a functional fluid selectively to at least a first region of a high surface energy area formed in a wettability variable layer of the laminated structure. In the step, the droplet is supplied by inkjet printing, and a center position of the droplet is determined in such a manner as to satisfy both Equations (1) and (2) below:

$$X < \pm (L+2S-D-2\alpha)/2 \text{ (here, } L+2S>D+2\alpha) \quad (1)$$

$$X < \pm (L+D-2\alpha)/2 \text{ (here, } L+2D>D+2\alpha) \quad (2),$$

where X is a distance between a center position of the first region and the center position of the droplet, D is a diameter of the droplet when travelling, α is variation in a landing position of the droplet, L is width of the first region, and S is a gap between the first and the second regions.

6 Claims, 18 Drawing Sheets

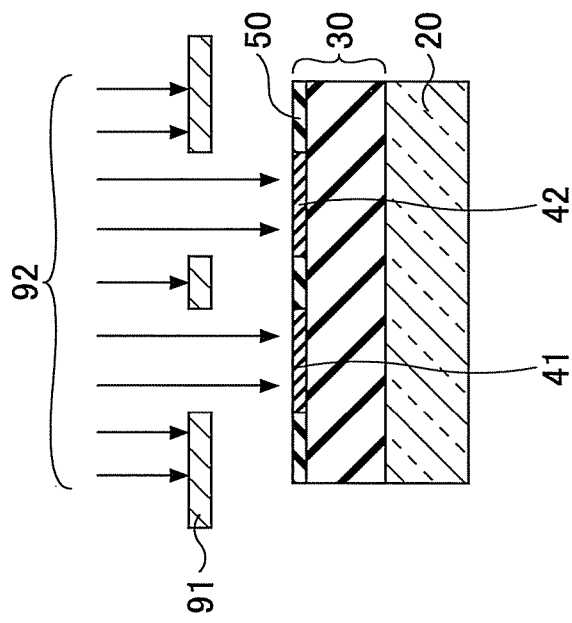
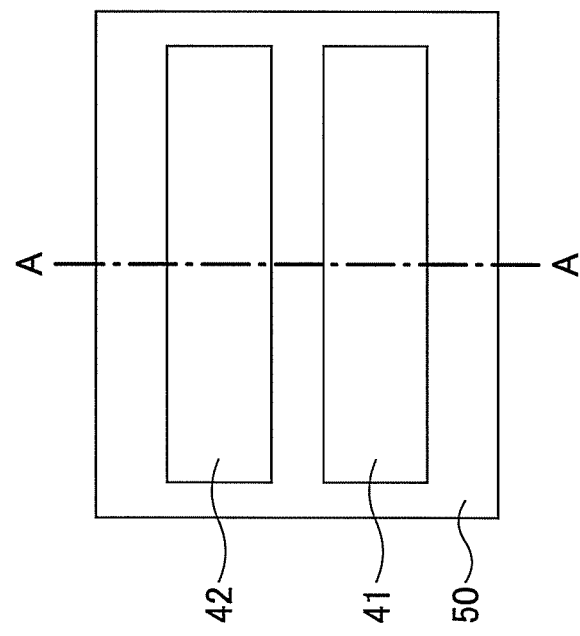

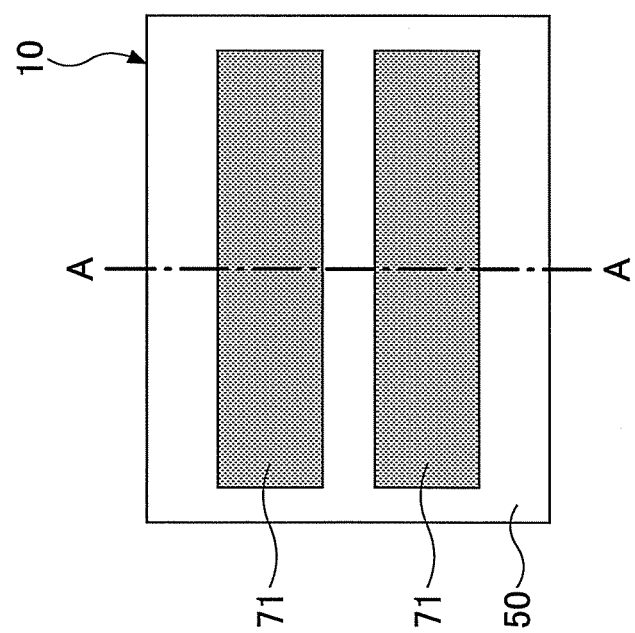
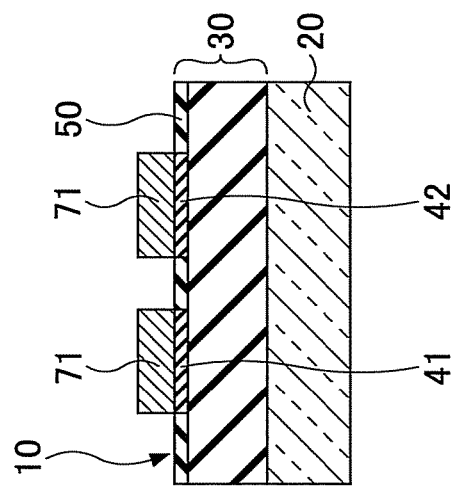

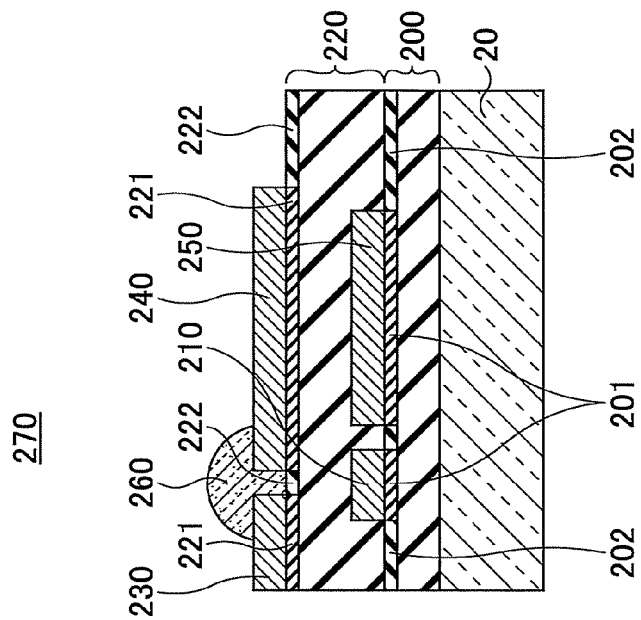
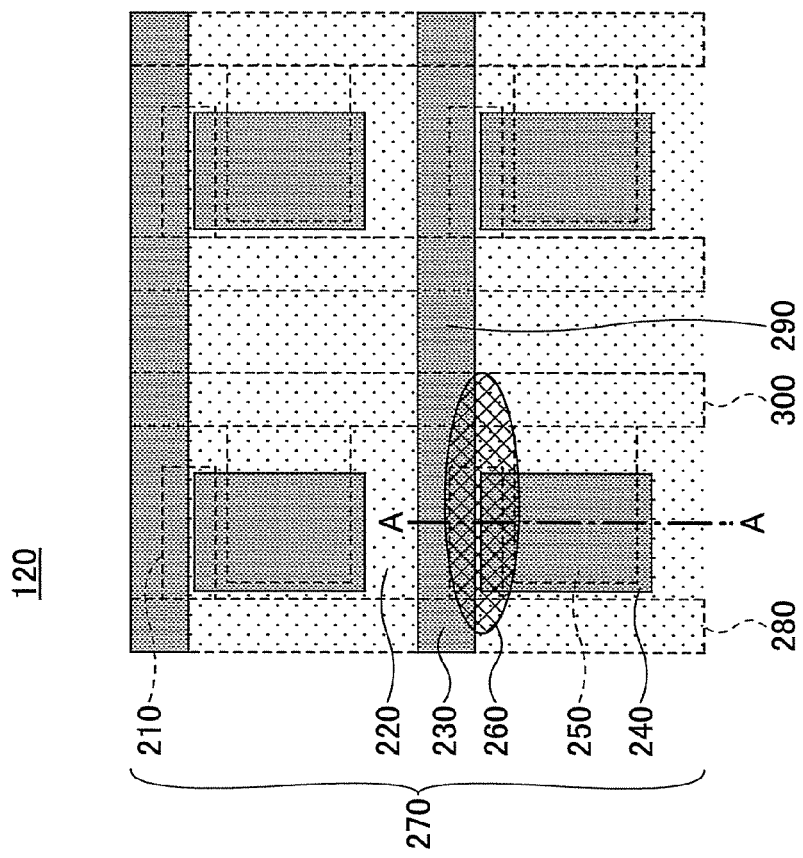
FIG.11B
FIG.11A

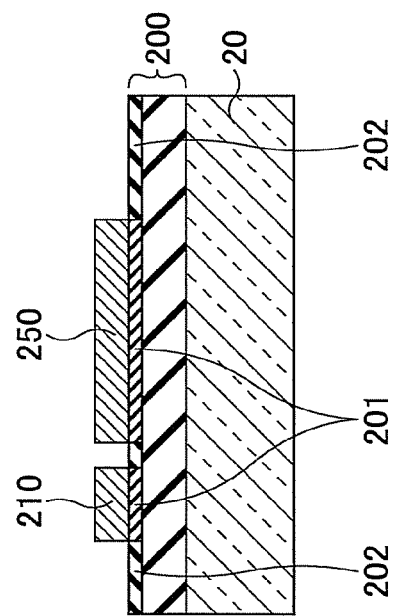
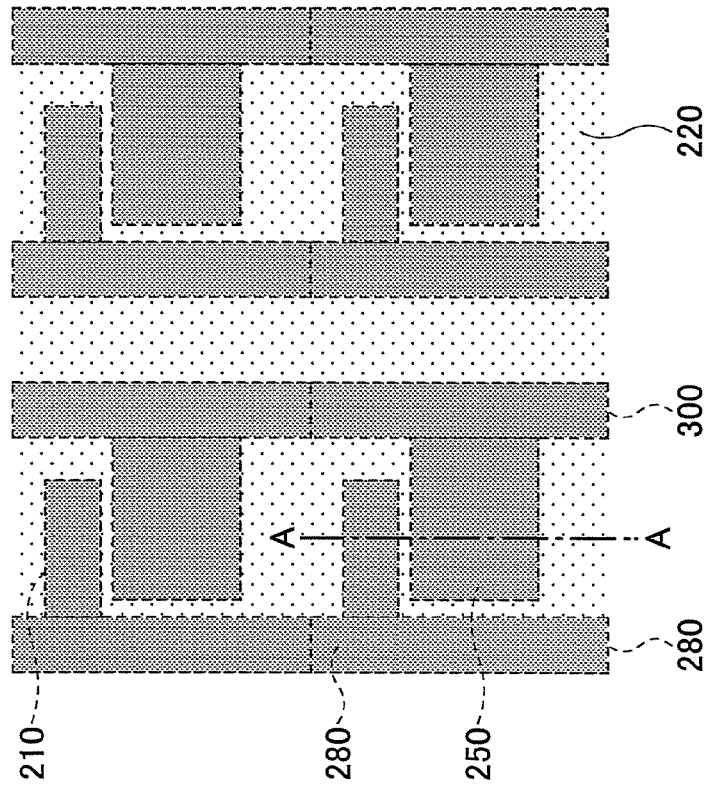

LAMINATED STRUCTURE, MULTILAYER WIRING BOARD, ACTIVE MATRIX SUBSTRATE, IMAGE DISPLAY APPARATUS, AND METHOD FOR MANUFACTURING LAMINATED STRUCTURE

CROSS-REFERENCE TO RELATED APPLICATIONS

This patent application is based upon and claims the benefit of priority of Japanese Patent Application No. 2010-048127 filed on Mar. 4, 2010 the entire contents of which are incorporated herein by reference.

BACKGROUND OF THE INVENTION

1. Field of the Invention

The present invention is generally directed to a laminated structure, a multilayer wiring board, an active matrix substrate, an image display apparatus and a method for manufacturing the laminated structure.

2. Description of the Related Art

In order to form electrodes, insulators, semiconductors and the like of, for example, electrical circuits, inkjet printing is used to supply a functional fluid including functional materials for these devices to specified areas on a substrate. Inkjet printing has advantages over photolithography using an exposing device in terms of not requiring costly devices and equipment while requiring a lesser number of processing steps and achieving high efficiency in the use of materials. On the other hand, however, it has been generally difficult to form microscopic patterns with a line width of 50 μm or less according to conventional inkjet printing because of the reasons such as: the difficulty in controlling droplets of 1 pL or less and, thus, the existence of a lower limit in the size of droplets; variation in the landing positions of the functional fluid in the case of using multiple nozzles; and spread of the functional fluid over the printing surface after the landing.

To address these problems, Patent Document 1 discloses a method for manufacturing a laminated structure using a wettability variable layer whose surface energy changes when energy is applied. The application of energy to the wettability variable layer allows the formation of a high surface energy area with hydrophilic properties for a functional fluid and a low surface energy area with hydrophobic properties for the functional fluid. Herewith, by selectively supplying droplets of the functional fluid containing a conductive material to the high surface energy area, it is possible to form a laminated structure having a microscopic conductive layer.

Patent Document 2 discloses a method for manufacturing a color filter that preliminarily forms banks functioning as partitions of pixels. The patent document claims that, by using the difference in the wettability between pixel areas (areas to be colored) and partition areas surrounding the pixel areas and, in addition, adjusting the droplet diameter of the functional fluid according to the partition width and the pixel width, it is possible to form, with a high yield, a color filter having excellent uniformity and causing neither color mixture between adjacent pixels nor "white dot defects".

[Patent Document 1] Japanese Laid-open Patent Application Publication No. 2005-310962
[Patent Document 2] Japanese Laid-open Patent Application Publication No. 2004-109209

However, according to the manufacturing method disclosed in Patent Document 1, there is a limit to the microfabrication in the case of forming conductive layers over two adjacent high surface energy areas separated by a very small low surface energy area because the two high surface energy areas may be connected to each other by a droplet landed near the low surface energy area.

The manufacturing method disclosed in Patent Document 2 requires photolithography to create the banks, which leads to an increase in production cost. In addition, since the droplet diameter of the functional fluid has to be adjusted according to the pixel width and bank width, there is a limit when the disclosed manufacturing technology is applied to, for example, a wiring pattern in which different line widths are used.

SUMMARY OF THE INVENTION

Accordingly, embodiments of the present invention may provide a novel and useful laminated structure solving one or more of the problems discussed above.

In view of the above-described problems, the embodiments of the present invention may provide a laminated structure having a microscopic conductive layer formed by inkjet printing, a multilayer wiring board, an active matrix substrate, an image display apparatus and a method for manufacturing the laminated structure.

One aspect of the present invention may be to provide a method for manufacturing a laminated structure including a wettability variable layer that contains a wettability variable material whose surface energy changes when energy is applied thereto and includes at least a high surface energy area having high surface energy and a low surface energy area having low surface energy, and a conductive layer disposed on the high surface energy area. The method includes a first step of forming the wettability variable layer containing the wettability variable material; a second step of applying the energy to parts of the wettability variable layer and thereby forming the high surface energy area including a first region and a second region adjacent to each other and separated by the low surface energy area therebetween and having higher surface energy than the low surface energy area; a third step of supplying a droplet of a functional fluid containing a conductive material selectively to at least the first region; and a fourth step of drying the supplied functional fluid and thereby forming, on the high surface energy area, the conductive layer including the conductive material. In the third step, the droplet of the functional fluid is supplied by inkjet printing, and a center position of the supplied droplet is determined in such a manner as to satisfy both Equation (1) and Equation (2):

$$X < \pm(L+2S-D-2\alpha)/2 \text{ (here, } L+2S > D+2\alpha) \quad \text{Equation (1);}$$

and $$X < \pm(L+D-2\alpha)/2 \text{ (here, } L+2D > D+2\alpha) \quad \text{Equation (2),}$$

where X is a distance between a center position of the first region and the center position of the droplet, D is a diameter of the droplet when travelling, α is variation in a landing position of the droplet, L is width of the first region, and S is a gap between the first and the second regions.

Another aspect of the present invention is a laminated structure manufactured by a laminated structure manufacturing method. The laminated structure includes a wettability variable layer containing a wettability variable material whose surface energy changes when energy is applied thereto and including at least a high surface energy area having high surface energy and a low surface energy area having low surface energy; and a conductive layer disposed on the high surface energy area. The laminated structure manufacturing method includes a first step of forming the wettability variable layer containing the wettability variable material; a second step of applying the energy to parts of the wettability variable layer and thereby forming the high surface energy area including a first region and a second region adjacent to each other and separated by the low surface energy area therebetween and having higher surface energy than the low surface energy area; a third step of supplying a droplet of a functional fluid containing a conductive material selectively to at least the first region; and a fourth step of drying the supplied functional fluid and thereby forming, on the high surface energy area, the conductive layer including the conductive material. In the third step, the droplet of the functional fluid is supplied by inkjet printing, and a center position of the supplied droplet is determined in such a manner as to satisfy both Equation (1) and Equation (2):

$$X < \pm(L+2S-D-2\alpha)/2 \text{ (here, } L+2S > D+2\alpha) \quad \text{Equation (1);}$$

and $$X < \pm(L+D-2\alpha)/2 \text{ (here, } L+2D > D+2\alpha) \quad \text{Equation (2),}$$

where X is a distance between a center position of the first region and the center position of the droplet, D is a diameter of the droplet when travelling, $\alpha$ is variation in a landing position of the droplet, L is width of the first region, and S is a gap between the first and the second regions.

Yet another aspect of the present invention is an active matrix substrate including a transistor which includes a gate electrode, a gate insulating layer, a source electrode, a drain electrode, a capacitor electrode and a semiconductor layer; a gate signal line extending in one direction from the gate electrode; a source signal line extending from the source electrode, in a direction substantially perpendicular to the direction in which the gate signal line extends; a common signal line extending from the capacitor electrode, substantially parallel to the direction in which the gate signal line or the source signal line extends; and a laminated structure manufactured by a laminated structure manufacturing method and including a wettability variable layer that containes a wettability variable material whose surface energy changes when energy is applied thereto and includes at least a high surface energy area having high surface energy and a low surface energy area having low surface energy, and a conductive layer disposed on the high surface energy area. The laminated structure manufacturing method includes a first step of forming the wettability variable layer containing the wettability variable material; a second step of applying the energy to parts of the wettability variable layer and thereby forming the high surface energy area including a first region and a second region adjacent to each other and separated by the low surface energy area therebetween and having higher surface energy than the low surface energy area; a third step of supplying a droplet of a functional fluid containing a conductive material selectively to at least the first region; and a fourth step of drying the supplied functional fluid and thereby forming, on the high surface energy area, the conductive layer including the conductive material. In the third step, the droplet of the functional fluid is supplied by inkjet printing, and a center position of the droplet in the supplication is determined in such a manner as to satisfy both Equation (1) and Equation (2):

$$X < \pm(L+2S-D-2\alpha)/2 \text{ (here, } L+2S > D+2\alpha) \quad \text{Equation (1);}$$

and $$X < \pm(L+D-2\alpha)/2 \text{ (here, } L+2D > D+2\alpha) \quad \text{Equation (2),}$$

where X is a distance between a center position of the first region and the center position of the droplet, D is a diameter of the droplet when travelling, $\alpha$ is variation in a landing position of the droplet, L is width of the first region, and S is a gap between the first and the second regions, wherein the conductive layer disposed on the high surface energy area is used as at least one of the gate electrode, the source electrode, the drain electrode, the capacitor electrode, the gate signal line, the source signal line and the common signal line.

Additional objects and advantages of the embodiments will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE DRAWINGS

FIGS. 3A and 3B are a second set of drawings illustrating the method for manufacturing the laminated structure according to the embodiment of the present invention;

FIGS. 5A and 5B are a fourth set of drawings illustrating the method for manufacturing the laminated structure according to the embodiment of the present invention;

FIGS. 11A and 11B are drawings illustrating an active matrix substrate according to the embodiment of the present invention;

FIGS. 12A and 12B are a first set of drawings illustrating a method for manufacturing the active matrix substrate according to the embodiment of the present invention;

DETAILED DESCRIPTION OF THE PREFERRED EMBODIMENTS

Figure 1:
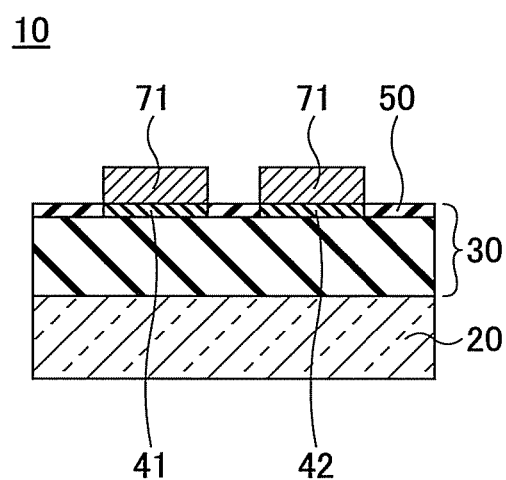
FIG. 1 is a cross-sectional diagram illustrating an example of a laminated structure according to an embodiment of the present invention.

An embodiment that describes the best mode for carrying out the present invention is explained next with reference to the drawings. Note that in the drawings, identical reference numerals represent the same component, and repeated explanation may be omitted.

[Configuration of Laminated Structure]

First is explained a general configuration of a laminated structure according to the present embodiment. FIG. 1 is a cross-sectional diagram illustrating the laminated structure according to the present embodiment. With reference to FIG. 1, a laminated structure 10 according to the present embodiment has a configuration in which a wettability variable layer 30 and conductive layers 71 are laid over a substrate 20.

For the substrate 20, for example, a glass substrate, a silicon substrate, a stainless steel substrate, or a film substrate may be used. Examples of the film substrate include a polyimide (PI) substrate, a polyether sulphone (PES) substrate, a polyethylene terephthalate (PET) substrate, and a polyethylene naphthalete (PEN) substrate.

The wettability variable layer 30 includes a wettability variable material whose surface energy (critical surface tension) changes when energy, such as heat, an electron beam, ultraviolet light or plasma, is applied thereto. For the wettability variable material, a polymer material having hydrophobic groups in the side chains may be used. For the polymer material, specifically, a polymer material may be used in which the side chains having hydrophobic groups are bonded, directly or via a binding group, to the main chain having a polyimide or (meth) acrylate structure. The hydrophobic groups are preferably fluoroalkyl groups having fluorine atoms or hydrocarbon groups having no fluorine atom, for example. In the surface region of the wettability variable layer 30, a first region 41 and a second region 42 of a high surface energy area having relatively high surface energy (critical surface tension) and a low surface energy area 50 having relatively low surface energy (critical surface tension) are formed.

The conductive layers 71 are formed over the first and second regions 41 and 42 of the high surface energy area making up the wettability variable layer 30. The conductive layers 71 may be made of, for example, a material including metal particles made of Au, Ag, Cu, Pt, Al, Ni, Pd, Pb, In, Sn, Zn, Ti, an alloy material of these, or a transparent conductor, such as indium oxide, zinc oxide, tin oxide and gallium oxide; a material including a metal complex; or a material including a conductive polymer made by doping doped PANI (polyaniline) or PEDOT (polyethylene dioxithiophene) with PSS (polystyrene sulfonate).

The laminated structure according to the present embodiment may be applied to a multilayer wiring board having, for example, a substrate, an insulator layer which is a wettability variable layer formed on the substrate, and an electrode layer which is a conductive layer formed on a high surface energy area of the insulator layer. Also, the laminated structure according to the present embodiment may be applied to an active matrix substrate or the like, in which the laminated structure serves as a transistor. By using the active matrix substrate according to the present embodiment, it is possible to achieve a high-performance image display apparatus at low cost.

[Manufacturing Method of Laminated Structure]

Next is described a method for manufacturing the laminated structure according to the present embodiment. FIGS. 2A to 5B illustrate the method for manufacturing the laminated structure according to the present embodiment. Note that FIGS. 2A, 3A, 4A and 5A are plan views and FIGS. 2B, 3B, 4B and 5B are cross-sectional diagrams of FIGS. 2A, 3A, 4A and 5A, respectively, along line A-A.

The method for manufacturing the laminated structure of the present embodiment includes a first process (FIGS. 2A and 2B) of forming the wettability variable layer 30; a second process (FIGS. 3A and 3B) of applying energy, such as ultraviolet light, to parts of the wettability variable layer 30 to form the first and second regions 41 and 42 of the high surface energy area and the low surface energy area 50 in the wettability variable layer 30; a third process (FIGS. 4A and 4B) of selectively supplying droplets of a functional fluid 61 containing a conductive material onto the first and second regions 41 and 42 of the high surface energy area; and a fourth process (FIGS. 5A and 5B) of drying the functional fluid 61 to form the conductive layers 71. Next are described the individual processes with reference to FIGS. 2A to 5B.

Figure 2B:
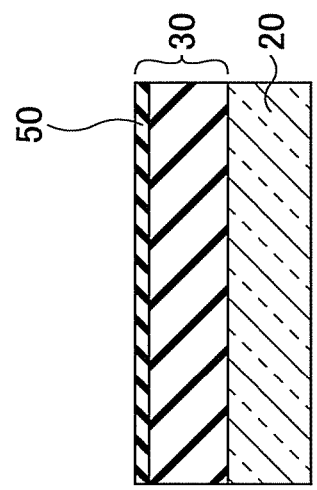
FIGS. 2A and 2B are a first set of drawings illustrating a method for manufacturing the laminated structure according to the embodiment of the present invention.
Figure 2A:
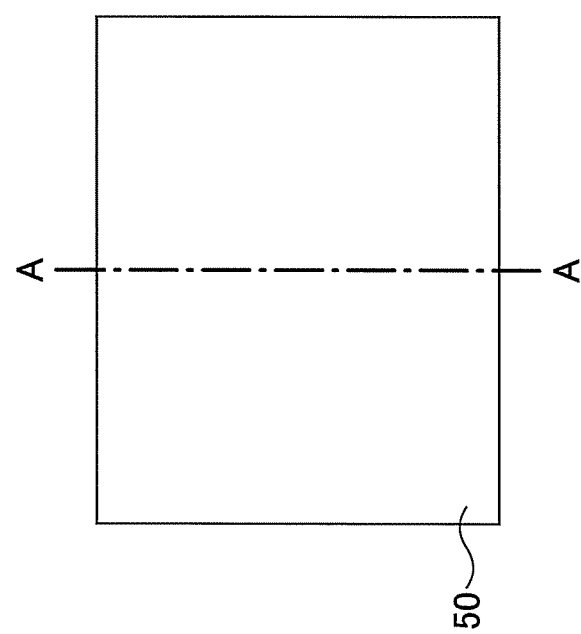

In the first process shown in FIGS. 2A and 2B, a liquid solution containing the above-mentioned wettability variable material is applied to the substrate 20 by, for example, spin-coating and, then, dried to form the wettability variable layer 30. For example, in the case where a polymer material having hydrophobic groups in the side chains is used as the wettability variable material, the wettability variable layer 30 having the low surface energy area 50 is formed on the substrate 20.

In the second process shown in FIGS. 3A and 3B, parts on the surface of the wettability variable layer 30 are exposed to ultraviolet light 92 using a photomask 91. In the parts of the wettability variable layer 30 exposed to the ultraviolet light 92, the bond of hydrophobic groups is cleaved off, and thereby the parts are modified from low surface energy (hydrophobic) to high surface energy (hydrophilic). Herewith, it is possible to form, in the surface region of the wettability variable layer 30, a pattern having the first and second regions 41 and 42 of the high surface energy area and the low surface energy area 50.

Figure 4B:
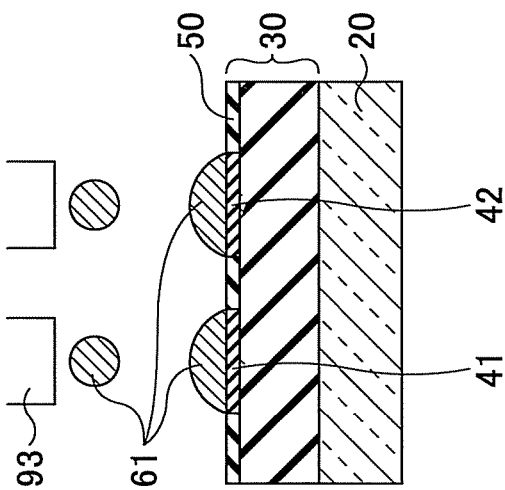
FIGS. 4A and 4B are a third set of drawings illustrating the method for manufacturing the laminated structure according to the embodiment of the present invention.
Figure 4A:
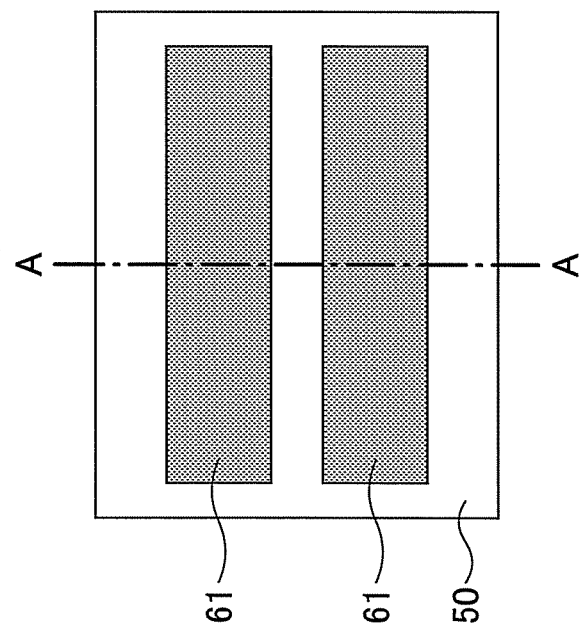

In the third process shown in FIGS. 4A and 4B, the functional fluid 61 containing a conductive material is selectively supplied onto the first and second regions 41 and 42 of the high surface energy area from droplet discharge nozzles 93. As a means of supplying the functional fluid 61, inkjet printing is preferable because of being able to supply microscopic droplets one at a time with high accuracy. The functional fluid 61 containing a conductive material may be an ink obtained by dispersing, in an organic solvent or water, microparticles of metal, such as Au, Ag, Cu, Pt, Al, Ni, Pd, Pb, In, Sn, Zn, Ti, an alloy material of these, or a transparent conductor, such as indium oxide, zinc oxide, tin oxide and gallium oxide; an ink obtained by dissolving a metal complex in an organic solvent or water; or an aqueous solution of a conductive polymer made by doping doped PANI (polyaniline) or PEDOT (polyethylene dioxithiophene) with PSS (polystyrene sulfonate).

To be used for inkjet printing, the functional fluid 61 preferably has a surface tension of 20 to 50 mN/m and a viscosity of 2 to 50 mPa·s. By defining a contact angle of the functional fluid 61 with the first and second regions 41 and 42 of the high surface energy area and a contact angle of the functional fluid 61 with the low surface energy area 50, it is possible to expand a dropping allowable range of the functional fluid 61 for the first and second regions 41 and 42 of the high surface energy area, which results in more stable formation of the conductive layers 71. In this case, it is preferable that the functional fluid 61 have a contact angle of 5° or less with the first and second regions 41 and 42 of the high surface energy area and a contact angle of 30° or more with the low surface energy area 50.

In the fourth process shown in FIGS. 5A and 5B, the functional fluid 61 is dried and solidified to form the conductive layers 71. Methods for drying the functional fluid 61 include a convection heat transfer method using, for example, an oven; a conductive heat transfer method using, for example, a hot plate; and a radiant heat transfer method using far-infrared rays or microwaves. Drying is not necessarily performed at atmospheric pressure but may be done at a reduced pressure where appropriate. Additionally, the dried and solidified conductive layers 71 may be heat-treated. In particular, when a nanometal ink is used as the functional fluid 61, sufficient electrical conductivity is difficult to achieve just by drying and solidifying the functional fluid 61, and it is therefore necessary to fuse nanoparticles by heat-treating the functional fluid 61. As described above, the laminated structure 10 of FIG. 1 is manufactured by the processes illustrated in FIGS. 2A to 5B.

Further details are provided below regarding the configuration of an inkjet apparatus used in the third process shown in FIGS. 4A and 4B and droplet positions of the functional fluid 61 in the third process of FIGS. 4A and 4B, with reference to FIGS. 6 to 10.

Figure 6:
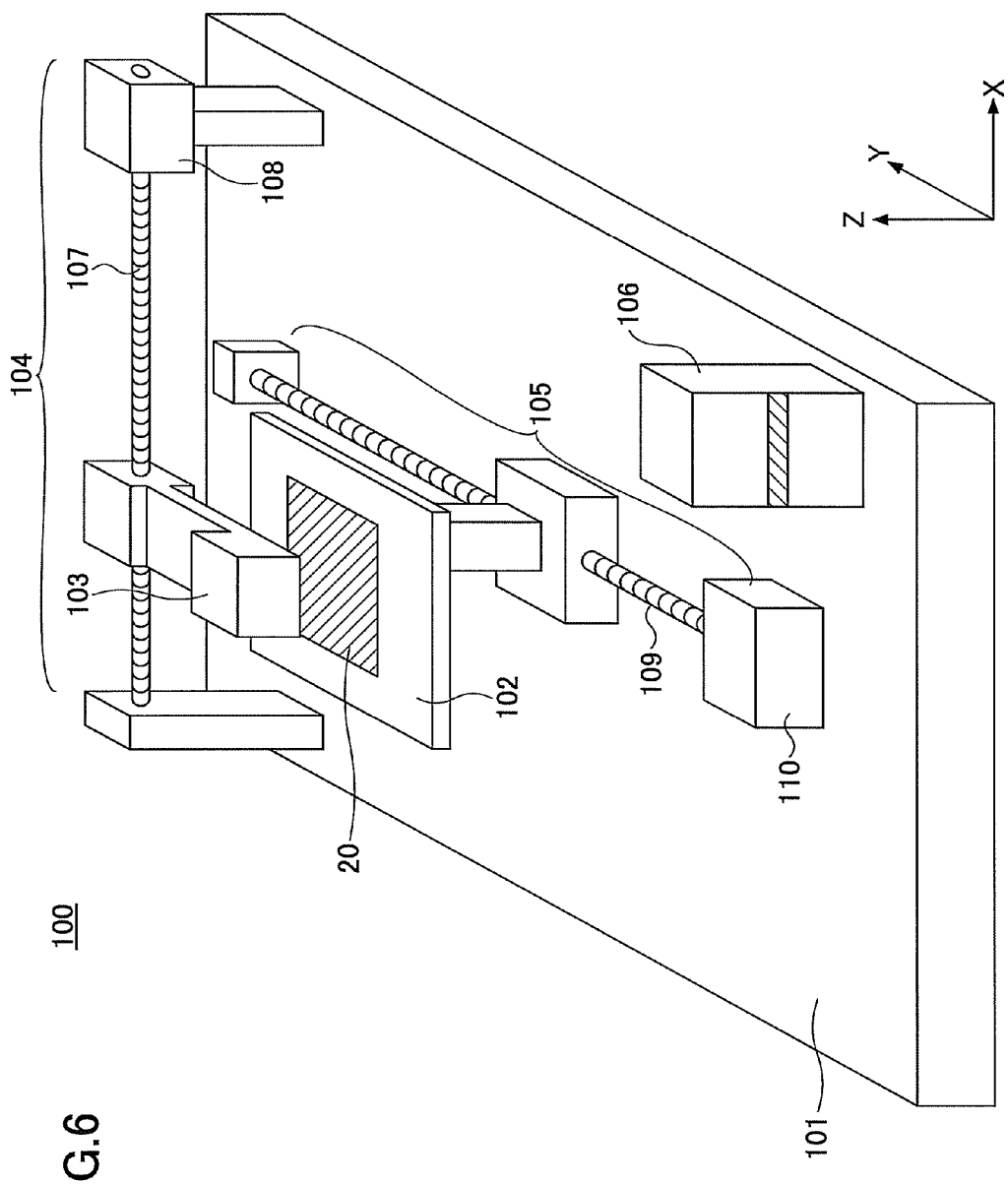
FIG. 6 is a schematic view illustrating a configuration of an inkjet apparatus.

FIG. 6 is a schematic view illustrating the configuration of the inkjet apparatus. An inkjet apparatus 100 of FIG. 6 includes a surface plate 101, a stage 102, a droplet discharge head 103, an X-axis direction movement mechanism 104 connected to the droplet discharge head 103, a Y-axis direction movement mechanism 105 connected to the stage 102, and a control device 106.

The stage 102 is provided to support the substrate 20 and, therefore, includes a fixation mechanism, such as a suction device (not shown) for causing the substrate 20 to adhere by suction. The stage 102 may also be equipped with a heating mechanism for drying droplets of the functional fluid 61 supplied onto the substrate 20.

The droplet discharge head 103 has, on its lower face, multiple droplet discharge nozzles (the droplet discharge nozzles 93 shown in FIG. 4B) arranged at regular intervals in the X-axis direction. The functional fluid 61 is jetted from the droplet discharge nozzles 93 onto the substrate 20 held on the stage 102. Piezo inkjet technology may be used for the droplet discharge mechanism of the droplet discharge head 103, and in this case, droplets are jetted by applying voltage to piezo elements provided in the droplet discharge head 103.

The X-axis direction movement mechanism 104 includes an X-axis direction drive shaft 107 and an X-axis direction drive motor 108. The X-axis direction drive motor 108 is implemented by, for example, a stepper motor. When an X-axis direction driving signal is supplied from the control device 106, the X-axis direction drive motor 108 operates the X-axis direction drive shaft 107 and thereby moves the droplet discharge head 103 in the X-axis direction.

The Y-axis direction movement mechanism 105 includes a Y-axis direction drive shaft 109 and a Y-axis direction drive motor 110. When a Y-direction driving signal is supplied from the control device 106, the Y-axis direction drive motor 110 operates the Y-axis direction drive shaft 109 and thereby moves the stage 102 in the Y-axis direction.

The control device 106 supplies a jetting control signal to the droplet discharge head 103. The control device 106 also supplies the X-axis direction driving signal and the Y-axis direction driving signal to the X-axis direction drive motor 108 and the Y-axis direction drive motor 110, respectively. Note that the control device 106 is electrically connected to each of the droplet discharge head 103, the X-axis direction drive motor 108 and the Y-axis direction drive motor 110 although the wiring is not shown.

The inkjet apparatus 100 causes the droplet discharge head 103 to jet droplets of the functional fluid 61 onto the substrate 20 held on the stage 102 while moving the droplet discharge head 103 and the stage 102 relative to each other. The inkjet apparatus 100 may also include, between the droplet discharge head 103 and the X-axis direction movement mechanism 104, a rotation mechanism which operates independently from the X-axis direction movement mechanism 104. The rotation mechanism changes the relative angle between the droplet discharge head 103 and the stage 102 and thereby adjusts the pitch between the droplet discharge nozzles 93. Also, the inkjet apparatus 100 may include, between the droplet discharge head 103 and the X-axis direction movement mechanism 104, a Z-axis direction movement mechanism which operates independently from the X-axis direction movement mechanism 104. The Z-axis direction movement mechanism moves the droplet discharge head 103 in the Z-axis direction and thereby arbitrarily adjusts the distance between the substrate 20 and the nozzle surface of the droplet discharge head 103. Furthermore, the inkjet apparatus 100 may include, between the stage 102 and the Y-axis direction movement mechanism 105, a rotation mechanism which operates independently from the Y-axis direction movement mechanism 105. The rotation mechanism rotates the stage 102, on which the substrate 20 is held, and thereby allows droplets of the functional fluid 61 to be jetted onto the substrate 20 tilted at a specified angle.

Figure 7A:
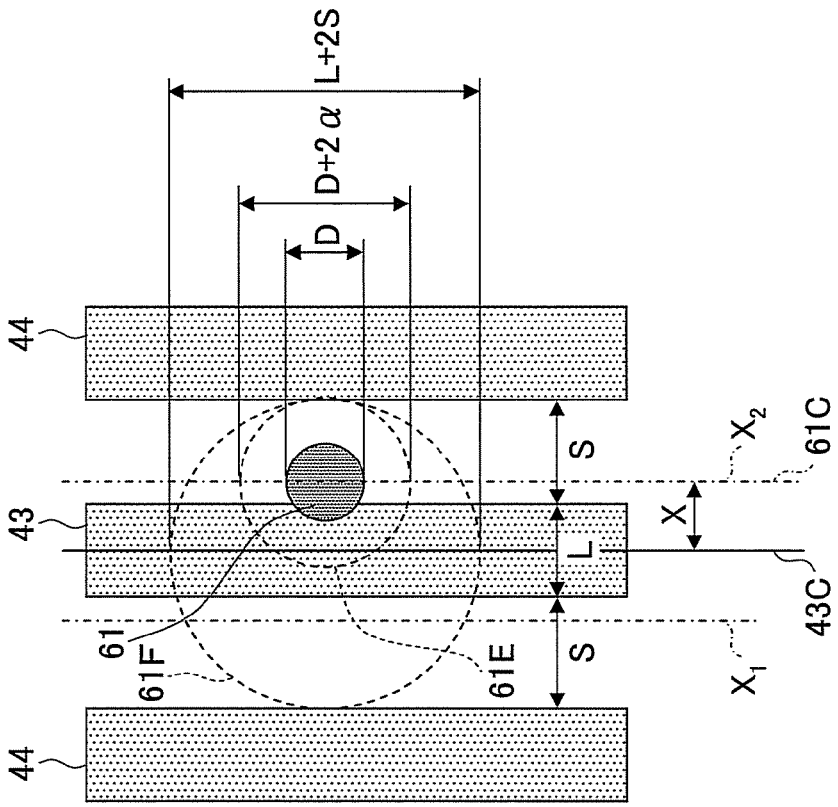
FIGS. 7A and 7B are drawings for explaining a first required condition related to a droplet position of a functional fluid.
Figure 7B:
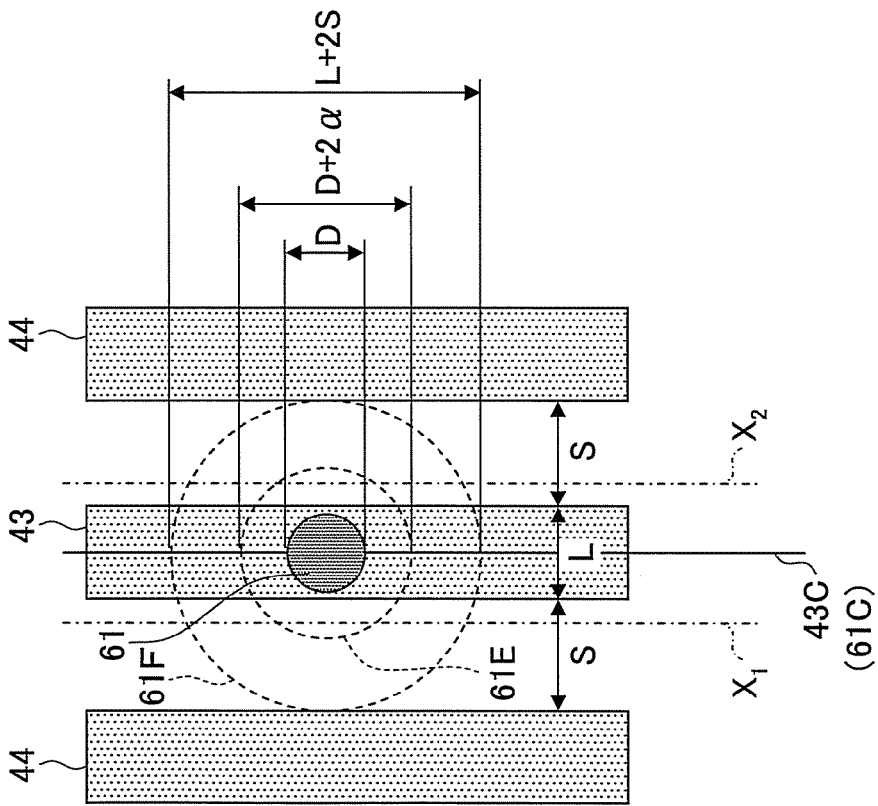

FIGS. 7A and 7B are drawings for explaining a first required condition related to the droplet position of the functional fluid 61. In FIGS. 7A and 7B, reference numeral 43 denotes a first region of the high surface energy area and reference numeral 44 denotes second regions of the high surface energy area, adjacent to the first region 43. Note that the surroundings of the first and second regions 43 and 44 of the high surface energy area are a low surface energy area. Reference numeral 43C denotes a center position of the first region 43; v reference numeral 61C, a droplet center position of the functional fluid 61; reference symbol D, a diameter of a travelling droplet of the functional fluid 61 jetted from the droplet discharge head 3; reference symbol α, a variation in the landing position of the functional fluid 61 due to the variation in the droplet discharge nozzles 93 and the like; reference symbol L, a line width of the first region 43; reference symbol S, a gap between the first region 43 and the respective second regions 44; and reference symbol X, a distance between the center position 43C of the first region 43 and the droplet center position 61C of the functional fluid 61. Note that FIG. 7A illustrates the case in which the distance X is zero (X=0); and FIG. 7B illustrates the case in which the distance X is $(L+2S-D-2\alpha)/2$ $(X=(L+2S-D-2\alpha)/2)$.

The first required condition related to the droplet position of the functional fluid 61 is that, when a droplet of the functional fluid 61 is supplied to the first region 43 in order to form a conductive layer in the first region 43, the dropped functional fluid 61 must not come in contact with either of the second regions 44. A dropping range 61E of the functional fluid 61 in view of the variation and the like has the shape of a circle with a diameter of (D+2α) around the droplet center position 61C of the functional fluid 61. Accordingly, the droplet center position 61C of the functional fluid 61 is determined in such a manner that the dropping range 61E does not overlap with either of the second regions 44, and herewith it is possible to form a conductive layer in the first region 43 in a stable manner. The diameter of a dropping allowable range 61F set to avoid the dropping range 61E of the functional fluid 61 from overlapping with either of the second regions 44 is expressed as (L+2S).

In the case where the dropping range 61E of the functional fluid 61 is in contact with one of the second regions 44, a location $X_1$ of the droplet center position 61C of the functional fluid 61 is expressed, with reference to the center position 43C of the first region 43, as $X_1=-(L+2S-D-2\alpha)/2$. Also, in the case where the dropping range 61E of the functional fluid 61 is in contact with the other one of the second regions 44, a location X2 of the droplet center position 61C of the functional fluid 61 is expressed, with reference to the center position 43C of the first region 43, as $X_2=(L+2S-D-2\alpha)/2$. Since the first required condition is $X_1<X<X_2$, the following Equation (1) is obtained.

$$X<\pm(L+2S-D-2\alpha)/2 \text{ (here, } L+2S>D+2\alpha) \quad \text{Equation (1),}$$

where X is the distance between the center position 43C of the first region 43 and the droplet center position 61C of the functional fluid 61; D is the diameter of a travelling droplet of the functional fluid 61; α is the variation in the landing position of the functional fluid 61; L is the line width of the first region 43; and S is the gap between the first region 43 and the respective second regions 44.

Figure 8A:
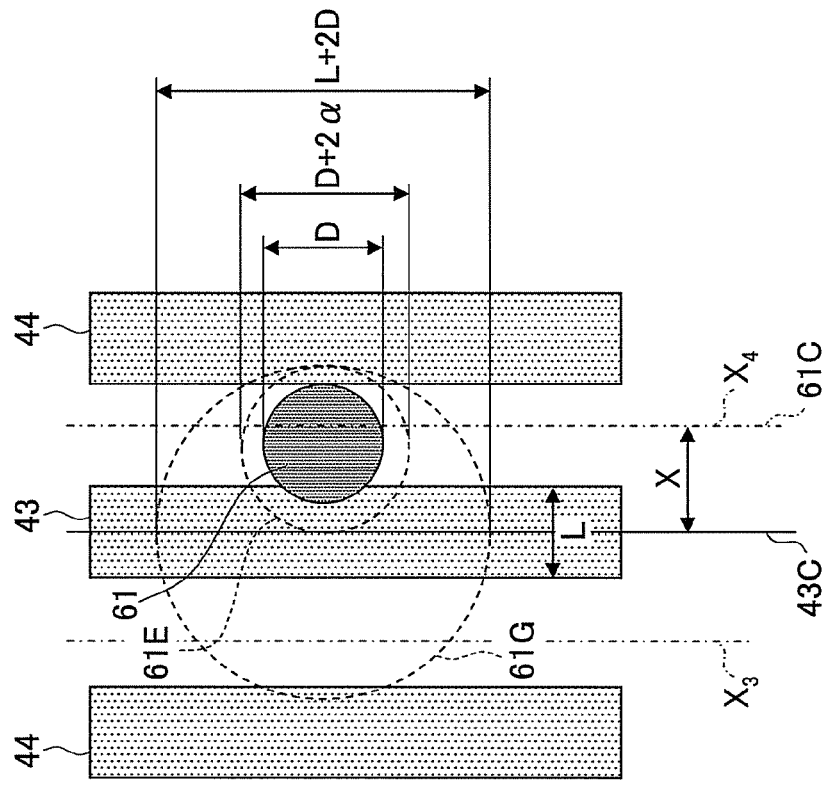
FIGS. 8A and 8B are drawings for explaining a second required condition related to the droplet position of the functional fluid.
Figure 8B:
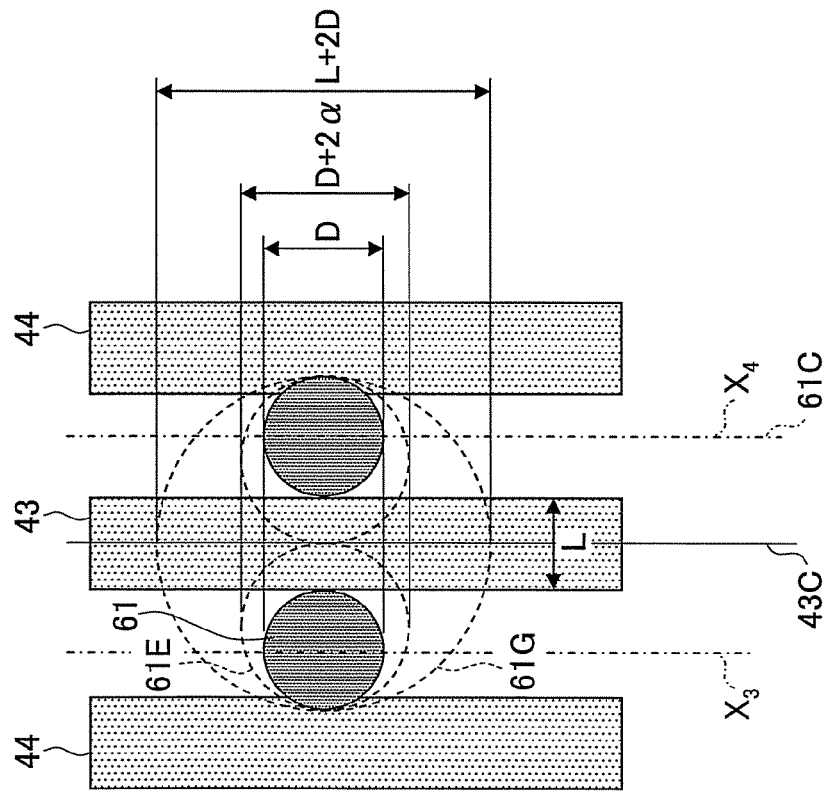

FIGS. 8A and 8B are drawings for explaining a second required condition related to the droplet position of the functional fluid 61. The second required condition related to the droplet position of the functional fluid 61 is that, in order to form a conductive layer in the first region 43, the supplied droplet of the functional fluid 61 must be disposed in a range in contact with the first region 43 with certainty, as shown in FIG. 8A. As a matter of course, the supplied droplet of the functional fluid 61 may overlap with the first region 43 as shown in FIG. 8B. The diameter of a dropping allowable range 61G set to cause the dropping range of the functional fluid 61 to overlap with the first region 43 is expressed as (L+2D), using the line width L of the first region 43 and the diameter D of a travelling droplet of the functional fluid 61.

In the case where the function fluid 61 is in contact with one side of the first region 43, a location $X_3$ of the droplet center position 61C of the functional fluid 61 is expressed, with reference to the center position 43C of the first region 43, as $X_3=-(L+D-2\alpha)/2$. Also, in the case where the function fluid 61 is in contact with the other side of the first region 43, a location $X_4$ of the droplet center position 61C of the functional fluid 61 is expressed, with reference to the center position 43C of the first region 43, as $X_4=(L+D-2\alpha)/2$. Since the second required condition is $X_3<X<X_4$, the following Equation (2) is obtained.

$$X<\pm(L+D-2\alpha)/2 \text{ (here, } L+2D>D+2\alpha) \quad \text{Equation (2),}$$

where X is the distance between the center position 43C of the first region 43 and the droplet center position 61C of the functional fluid 61; D is the diameter of a travelling droplet of the functional fluid 61; α is the variation in the landing position of the functional fluid 61; and L is the line width of the first region 43.

Note that in order to determine the first and second required conditions described above, the center position 43C of the first region 43 has to be determined first. If the first region 43 is, for example, in the shape of a line, the center position 43C of the first region 43 is preferably located along the center of the line in the line width direction. The shape of the first region 43 is not limited to a line, and may be an arbitrary shape, such as a regular polygon, a polygonal shape, a perfect circle or an ellipse. In this case, the center position 43C of the first region 43 is preferably located at the geometric center of the first region 43.

The droplet center position 61C of the functional fluid 61 is determined so as to satisfy both Equations (1) and (2) above. Herewith, it is possible to form a conductive layer in the first region 43 in a stable manner.

Figure 9:
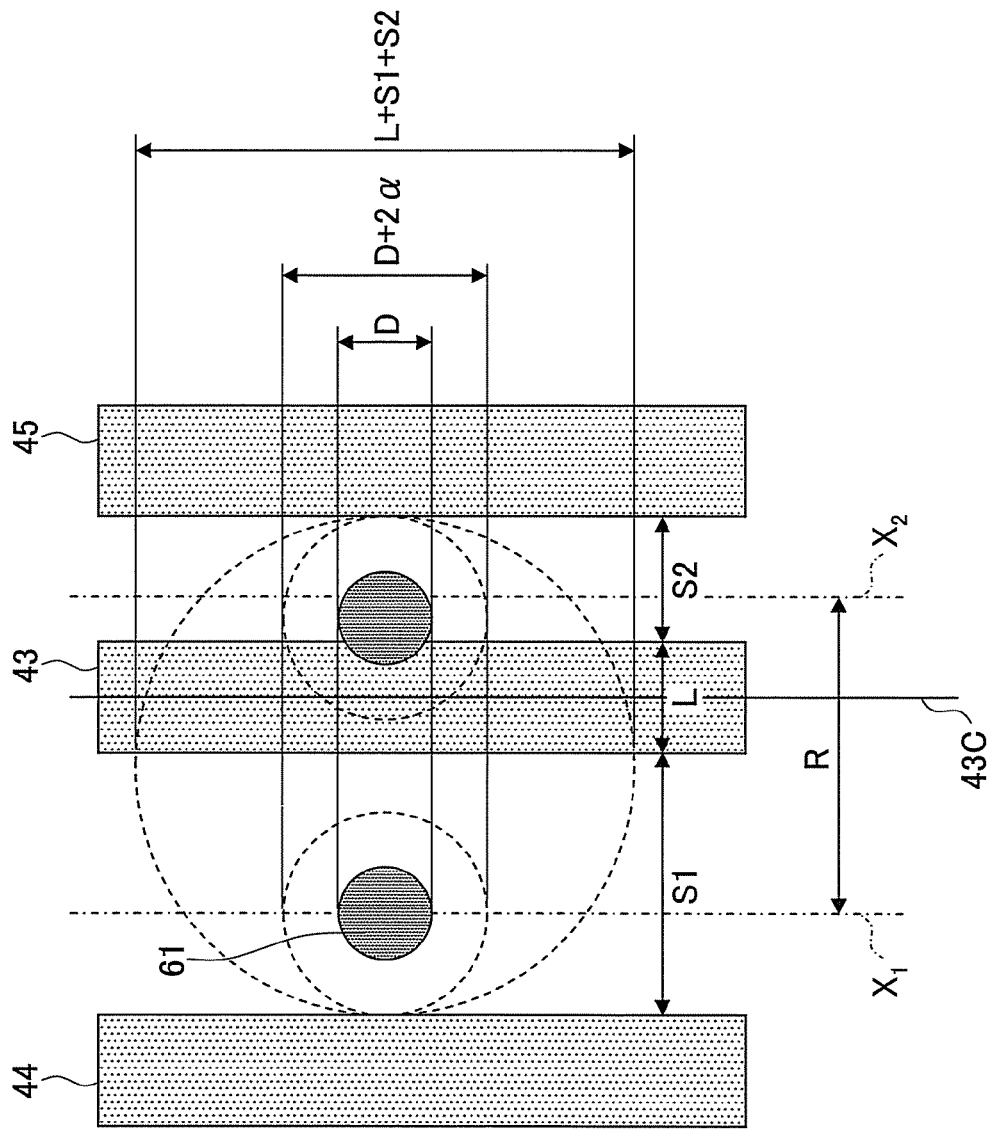
FIG. 9 is a drawing showing a first example of the droplet positions of the functional fluid.

FIG. 9 is a drawing showing a first example of the droplet position of the functional fluid 61. In FIG. 9, reference numeral 45 denotes a third region of the high surface energy area. Note that the surroundings of the first, second and third regions 43, 44 and 45 of the high surface energy area are a low surface energy area. Reference numeral S1 denotes a gap between the first and second regions 43 and 44; and reference numeral S2, a gap between the first and third regions 43 and 45. In FIG. 9, the gap S1 is greater than the gap S2. In this case, an allowable range R of the droplet center position has a wider cover width in the direction from the first region 43 toward the second region 44. Accordingly, in determining the droplet center position, the droplet center position may be shifted from the center of the line in the direction from the first region 43 toward the second region 44, in which direction the allowable range R of the droplet center position has a greater cover width.

Figure 10:
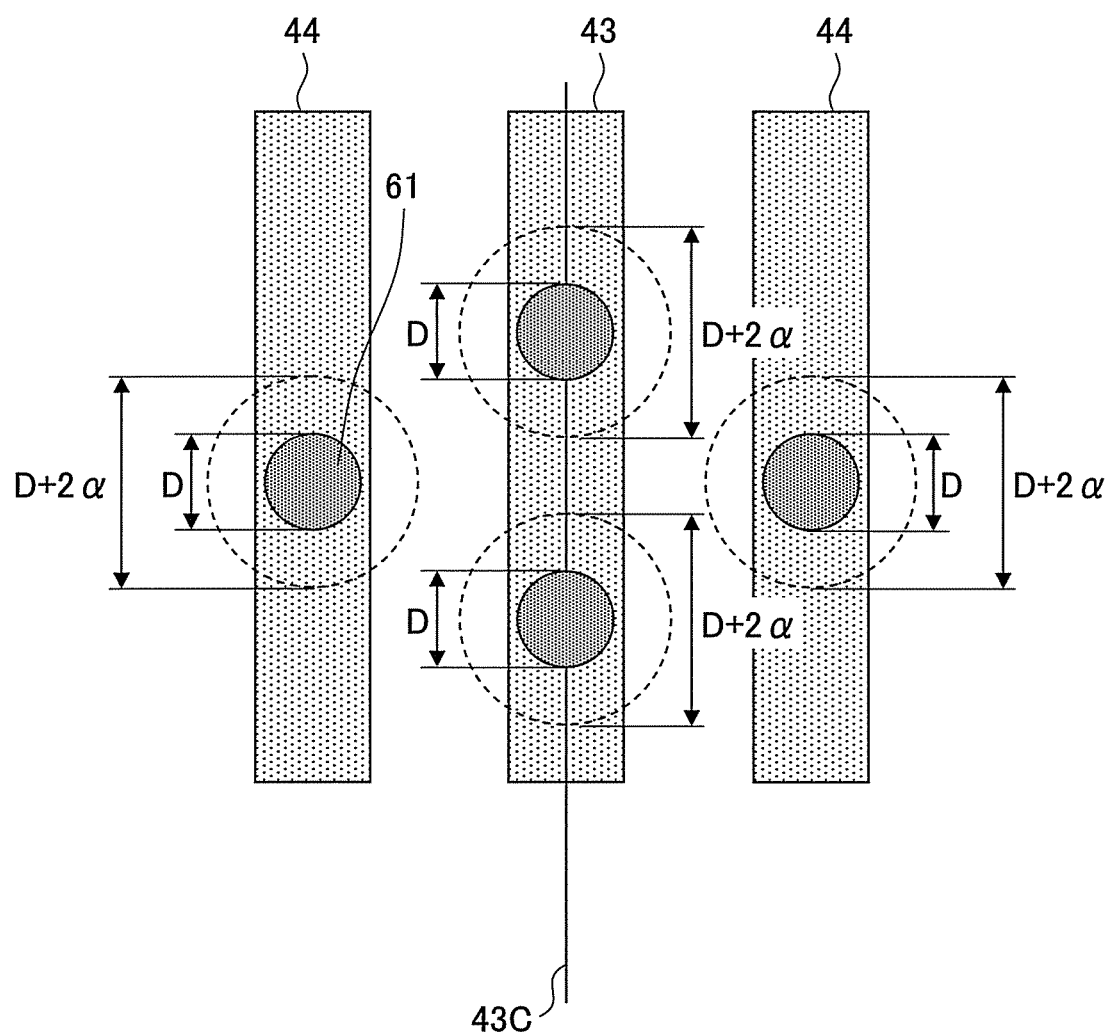
FIG. 10 is a drawing showing a second example of the droplet positions of the functional fluid.

FIG. 10 is a drawing showing a second example of the droplet position of the functional fluid 61. In the case when droplets of the functional fluid 61 are supplied to both first and second regions 43 and 44, sufficient distance needs to be provided so that the dropping range of each droplet of the functional fluid 61 does not overlap with that of any other droplet. Herewith, it is possible to form conductive layers in the first and second regions 43 and 44 in a more stable manner. Additionally, in this case, it is preferable that droplets of the functional fluid 61 be supplied in a staggered pattern, as shown in FIG. 10. Supplying the functional fluid 61 in a staggered pattern allows the spacing of the droplet center positions of the functional fluid 61 to be increased, which leads to the formation of microscopic conductive layers in a more stable manner.

[Configuration of Active Matrix Substrate]

Next is described a schematic configuration of an active matrix substrate according to the present embodiment. FIGS. 11A and 11B are drawings illustrating the active matrix substrate according to the present embodiment. FIG. 11A is a plan view and FIG. 11B is a cross-sectional diagram of FIG. 11A along line A-A. Note that FIG. 11B shows a transistor included in the active matrix substrate.

With reference to FIGS. 11A and 11B, an active matrix substrate 120 according to the present embodiment includes a transistor 270, a gate signal line 280, a source signal line 290 and a common signal line 300.

The transistor 270 is a laminated structure in which a wettability variable layer 200, a gate electrode 210 and a capacitor electrode 250, a gate insulating layer 220 which is a wettability variable layer, a source electrode 230 and a drain electrode 240, and a semiconductor layer 260 are sequentially disposed on the substrate 20.

More particularly, the wettability variable layer 200 in which high surface energy areas 201 and low surface energy areas 202 are formed adjacent to the surface is laid on top of the substrate 20. On the high surface energy areas 201 of the wettability variable layer 200, the gate electrode 210 and the capacitor electrode 250, which are conductive layers, are individually formed. On the wettability variable layer 200, the gate insulating layer 220 which is a wettability variable layer is laid in such a manner as to cover the gate electrode 210 and the capacitor electrode 250.

In the surface region of the gate insulating layer 220, which is a wettability variable layer, high surface energy areas 221 and low surface energy areas 222 are formed. On the high surface energy areas 221, the source electrode 230 and drain electrode 240, which are conductive layers, are formed respectively. A gap is provided between the source electrode 230 and the drain electrode 240, and the semiconductor layer 260 is formed over the source electrode 230 and the drain electrode 240 in such a manner as to fill the gap.

The gate signal line 280, which is a conductive layer, extends from the gate electrode 210 in one direction. The source signal line 290, which is a conductive layer, extends in a direction substantially perpendicular to the extending direction of the gate signal line 280. The common signal line 300, which is a conductive layer, extends from the capacitor electrode 250, substantially parallel to the extending direction of the gate signal line 280 or the source signal line 290. The gate signal line 280 and the common signal line 300 are respectively formed on the high surface energy areas 201 of the wettability variable layer 200. The source signal line 290 is formed on the high surface energy area 221 of the wettability variable layer 220. Note that, in the present configuration, the wettability variable layer 220 combines the function of a gate insulating layer, and the source signal line 290 combines the function of the source electrode 230.

As described above, the active matrix substrate 120 has the laminated structure according to the present embodiment. All the gate electrode 210, the source electrode 230, the drain electrode 240, the capacitor electrode 250, the gate signal line 280, the source signal line 290 and the common signal line 300 are provided as conductive layers of the laminated structure, and formed on the high surface energy areas of the wettability variable layers. Note however that not all of these elements need to be formed on the high surface energy areas of the wettability variable layers, and predetermined advantageous effects of the present embodiment are achieved by forming at least one of them on a high surface energy area of one of the wettability variable layers.

[Method for Manufacturing Active Matrix Substrate]

Figure 13B:
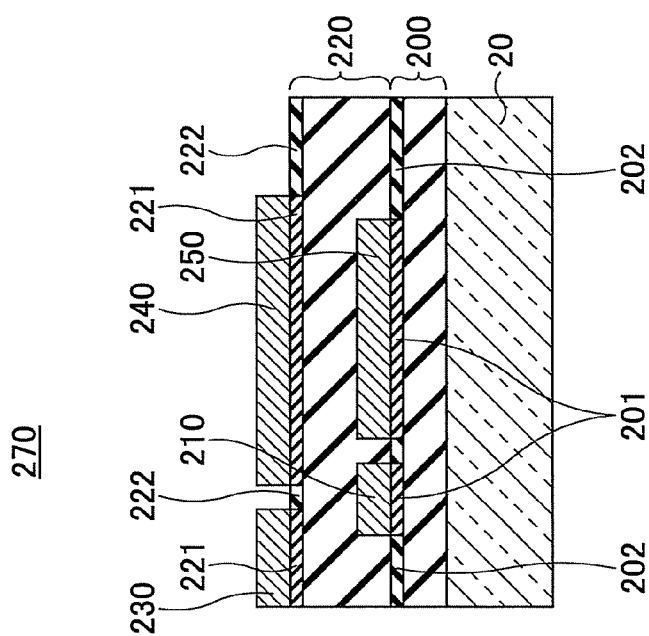
FIGS. 13A and 13B are a second set of drawings illustrating the method for manufacturing the active matrix substrate according to the embodiment of the present invention.
Figure 13A:
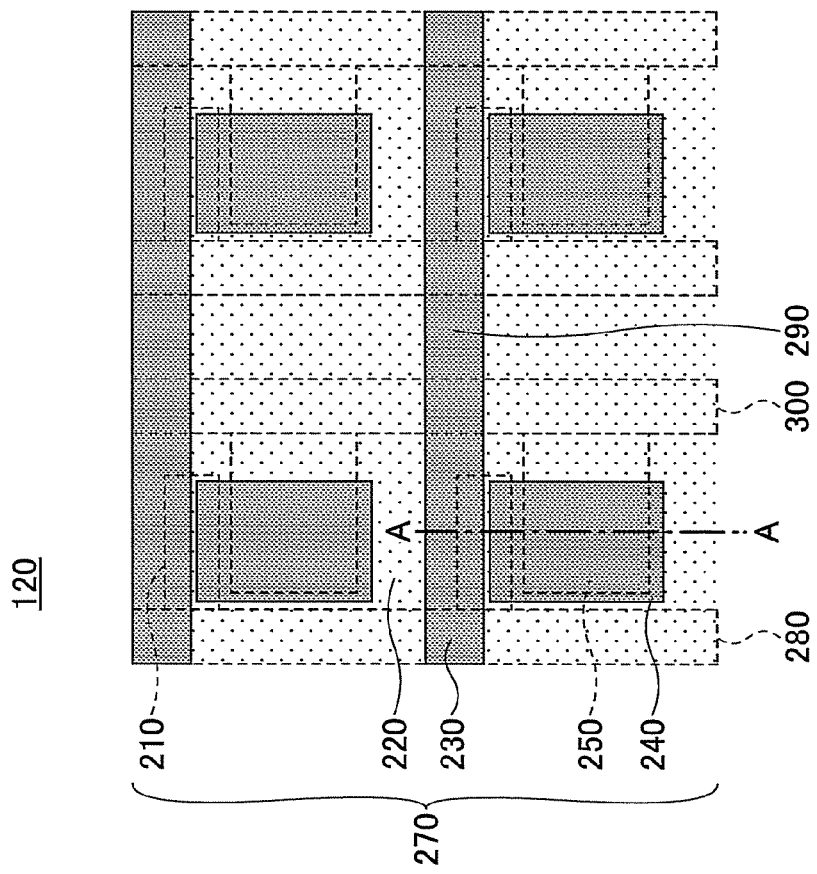

Next is described a method for manufacturing the active matrix substrate according to the present embodiment. FIGS. 12A to 13B are drawings illustrating the method for manufacturing the active matrix substrate according to the present embodiment. FIGS. 12A and 13A are plan views and FIGS. 12B and 13B are cross-sectional diagrams of FIGS. 12A and 13A, respectively, along line A-A.

First, in a process illustrated in FIGS. 12A and 12B, the wettability variable layer 200 is laid on top of the substrate 20 according to the method described with reference to FIGS. 2A and 2B. Second, the high surface energy areas 201 and the low surface energy areas 202 are formed in the surface region of the wettability variable layer 200 according to the method described with reference to FIGS. 3A and 3B. Then, the gate electrode 210, the capacitor electrode 250, the gate signal line 280 and the common signal line 300 are formed on the high surface energy areas 201 of the wettability variable layer 200 according to the methods described with reference to FIGS. 4A to 5B.

Next, in a process illustrated in FIGS. 13A and 13B, the gate insulating layer 220, which is a wettability variable layer, is laid on top of the wettability variable layer 200 in such a manner as to cover the gate electrode 210, the capacitor electrode 250, the gate signal line 280 and the common signal line 300 according to the method described with reference to FIGS. 2A and 2B. Subsequently, the high surface energy areas 221 and the low surface energy areas 222 are formed in the surface region of the gate insulating layer 220 according to the method described with reference to FIGS. 3A and 3B. Then, the source electrode 230, the drain electrode 240 and the source signal line 290 are formed on the high surface energy areas 221 of the gate insulating layer 220 according to the methods described with reference to FIGS. 4A to 5B.

After the process illustrated in FIGS. 13A and 13B, the semiconductor layer 260 is formed in such a manner as to be in contact with both the source electrode 230 and the drain electrode 240. Herewith, the active matrix substrate 120 shown in FIGS. 11A and 11B is completed.

Figure 14:
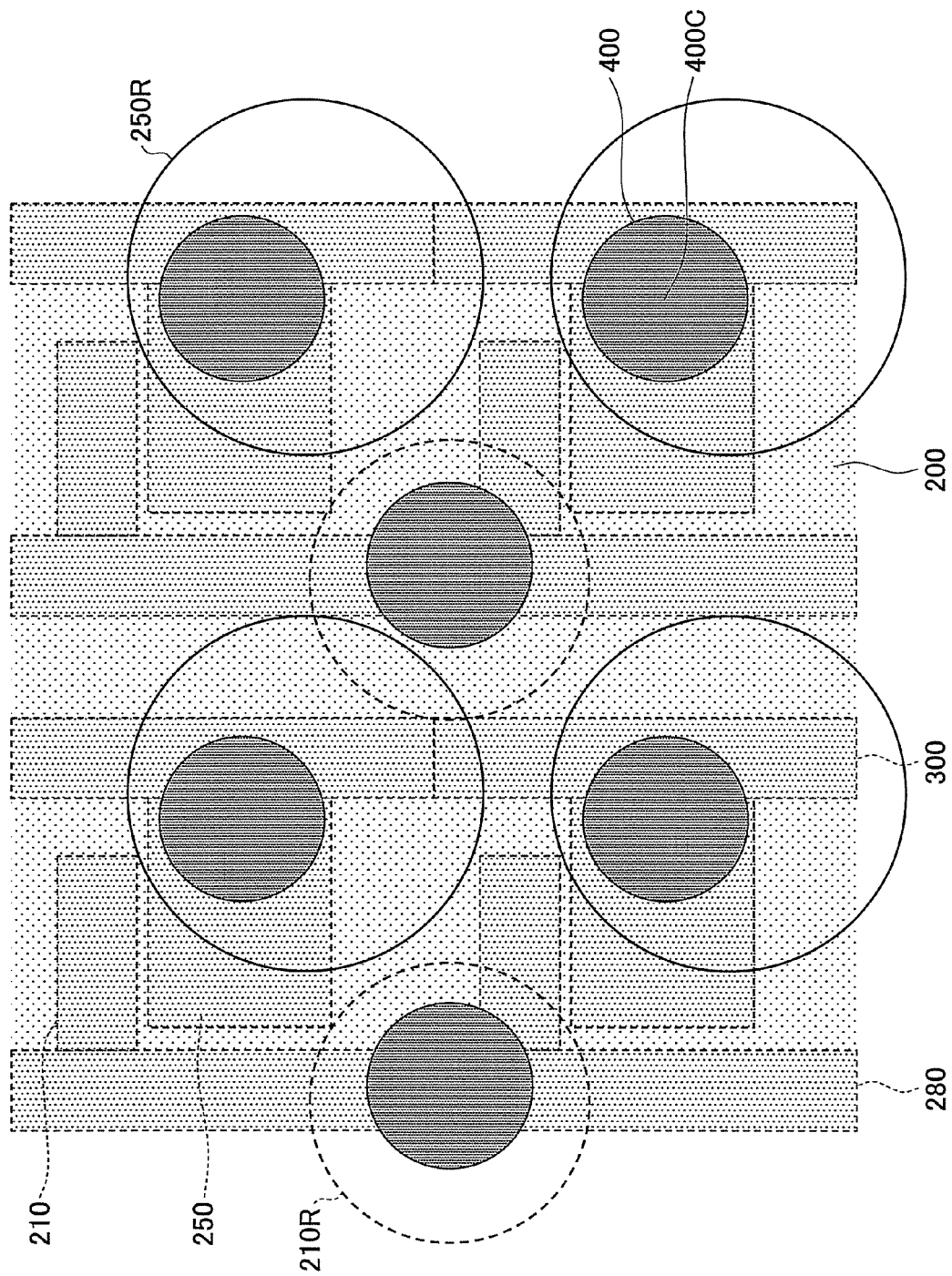
FIG. 14 is a drawing showing a first example of a method for determining a droplet center position of the functional fluid in the formation of the laminated structure according to the embodiment of the present invention.

Next is described, in greater detail, a method for determining a droplet center position of the functional fluid 61 in the formation of the laminated structure included in the above-mentioned active matrix substrate 120. FIG. 14 is a drawing showing a first example of the method for determining a droplet center position of the functional fluid 61 in the formation of the laminated structure according to the embodiment of the present invention.

First, the structure of one pixel of the active matrix substrate is focused on. Then, a largest circle is found which, in the formation of a predetermined conductive layer (for example, the gate electrode electrode 210 or the capacitor electrode 250), overlaps with the predetermined conductive layer but does not overlap with an adjacent conductive layer. This largest circle is a dropping allowable range. In FIG. 14, reference numeral 210R denotes a dropping allowable range for the gate electrode 210; reference numeral 250R denotes a dropping allowable range for the capacitor electrode 250; reference numeral 400 denotes a dropping range of the functional fluid 61 in view of the variation in the diameter of a travelling droplet of the functional fluid 61 and the variation in the landing position of the functional fluid 61; and reference numeral 400C denotes a droplet center position (the center of the dropping range 400). The gate electrode 210 and the gate signal line 280 are connected to each other, and also, the capacitor electrode 250 and the common signal line 300 are connected to each other, and therefore the respective paired components are considered here as conductive layers of the same element.

Next, the droplet center position 400C in the formation of each conductive layer is determined with reference to the corresponding dropping range 400 found in advance. That is, the droplet center position 400C is, first, determined in such a manner that the dropping range 400 does not extend outside the dropping allowable range 210R in the formation of the gate electrode 210, or that the dropping range 400 does not extend outside the dropping allowable range 250R in the formation of the capacitor electrode 250. Then, in order to form the conductive layer in a reliable fashion, the droplet center position 400C is determined in such a manner that an overlapping area between the dropping range 400 and the corresponding high surface energy area 201 becomes as large as possible. Note that the number of droplets of the functional fluid 61 supplied to each pixel does not have to be one, and multiple droplets may be supplied to each pixel as long as the aforementioned conditions are satisfied. Also, one droplet may be supplied for multiple pixels.

The dropping range 400 can be found in advance, for example, by using an observation instrument or the like for travelling droplets. For example, in the inkjet apparatus 100 of FIG. 6, a droplet jetted out from one of the droplet discharge nozzles 93 of the droplet discharge head 103 in a vertical direction (Z direction in FIG. 6) is observed using an observation mechanism, such as a camera, in two directions (X and Y directions in FIG. 6) parallel to the head surface and mutually orthogonal to each other. Herewith, it is possible to find, in the case when a droplet travels a predetermined distance, how far in the X and Y directions the landing position of the droplet is located off a position directly below the droplet discharge nozzle 93. The dropping range 400 can be determined by statistically finding spread in the landing positions obtained from such observations for all the droplet discharge nozzles 93 mounted on the droplet discharge head 103.

Figure 15:
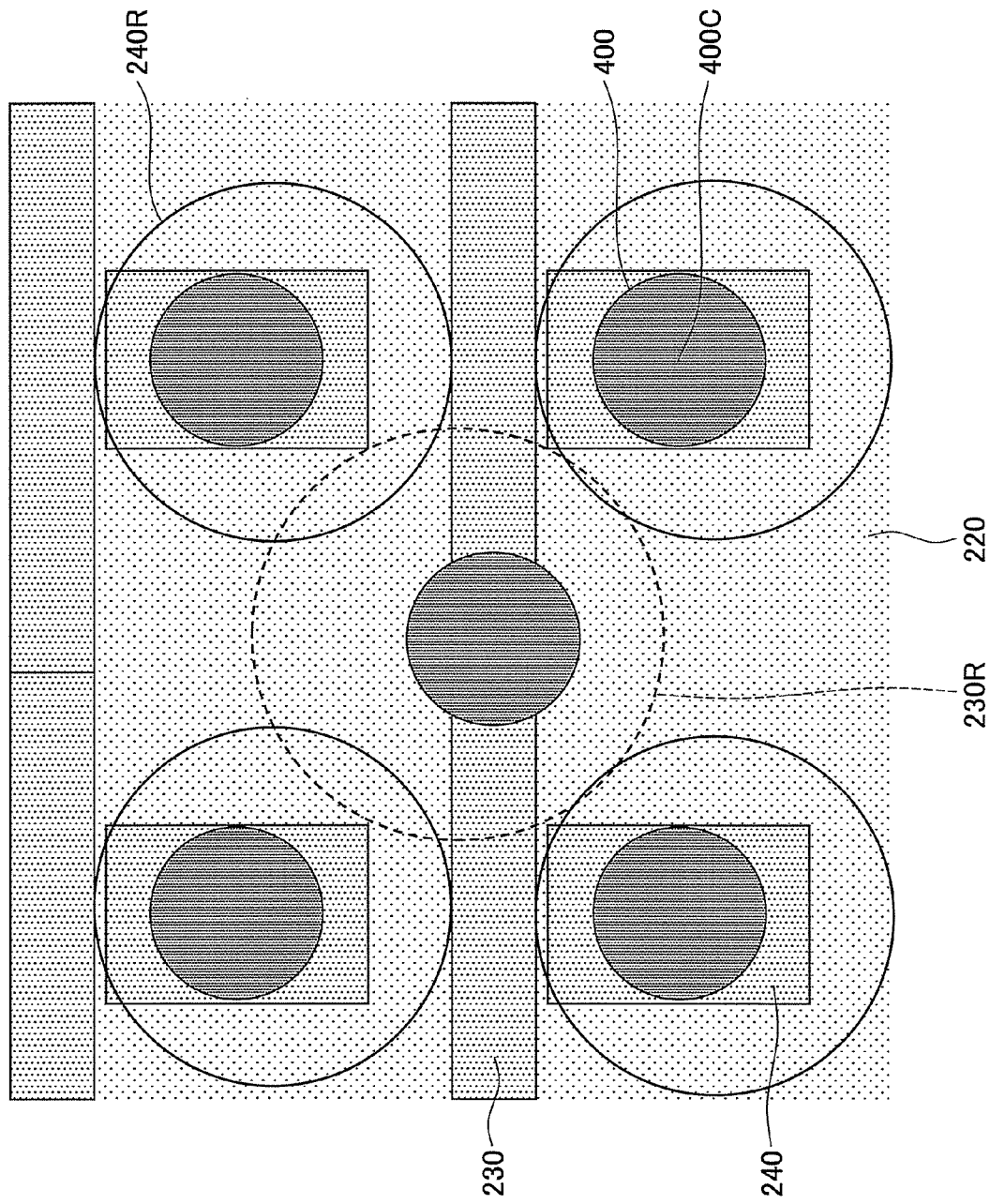
FIG. 15 is a drawing showing a second example of the method for determining the droplet center position of the functional fluid in the formation of the laminated structure according to the embodiment of the present invention.

FIG. 15 is a drawing showing a second example of the method for determining the droplet center position 400C of the functional fluid 61 in the formation of the laminated structure according to the present embodiment. In this case also, as in the case of FIG. 14, the structure of one pixel of the active matrix substrate is focused on. Then, a largest circle is found which, in the formation of a predetermined conductive layer (for example, the source electrode 230 or the drain electrode 240), overlaps with the predetermined conductive layer but does not overlap with an adjacent conductive layer(s). This largest circle is a dropping allowable range. In FIG. 15, reference numeral 230R denotes a dropping allowable range for the source electrode 230; and reference numeral 240R denotes a dropping allowable range for the drain electrode 240. The source electrode 230 and the source signal line 290 are connected to each other, and therefore these components are considered here as conductive layers of the same element.

Next, the droplet center position 400C in the formation of each conductive layer is determined with reference to the corresponding dropping range 400 found in advance. That is, the droplet center position 400C is, first, determined in such a manner that the dropping range 400 does not extend outside the dropping allowable range 230R in the formation of the source electrode 230, or that the dropping range 400 does not extend outside the dropping allowable range 240R in the formation of the drain electrode 240. Then, in order to form the conductive layer in a reliable fashion, the droplet center position 400C is determined in such a manner that an overlapping area between the dropping range 400 and the corresponding high surface energy area 221 becomes as large as possible. Here, the droplet center position 400C of the functional fluid 61 for forming the drain electrode 240 is set near the geometric center of the drain electrode 240, and the droplet center position 400C of the functional fluid 61 for forming the source electrode 230 is set on the line center of the source electrode 230. Note that the number of droplets of the functional fluid 61 supplied to each pixel does not have to be one, and multiple droplets may be supplied to each pixel as long as the aforementioned conditions are satisfied. Also, one droplet may be supplied for multiple pixels.

As has been described above, according to the present embodiment, it is possible to estimate the distance between the center position of a targeted first region and its corresponding droplet center position 400C of the functional fluid 61 based on the diameter of a travelling droplet of the functional fluid 61, the variation in the landing position of the functional fluid 61, the width of the first region and the gap between the first and second regions. Herewith, a microscopic conductive layer can be formed in the first region in a stable manner.

In addition, droplets of the functional fluid 61 for the first region and for the second region are supplied with separation therebetween in such a manner that their dropping ranges of the functional fluid 61 do not overlap with one another, and it is therefore possible to form conductive layers in both first and second regions in a stable manner.

Furthermore, arranging the droplet center positions of the functional fluid 61 in a staggered pattern allows a large space to be provided between adjacent droplets of the functional fluid 61. Herewith, it is possible to form conductive layers in both first and second regions in a more stable manner.

In addition, by defining the contact angle of the functional fluid 61, it is possible to expand the dropping allowable range of the functional fluid 61 for the high surface energy areas. Herewith, conductive layers can be formed in a more stable manner.

Furthermore, by using the laminated structure according to the present embodiment, it is possible to provide a microscopic multilayer wiring board at low cost.

In addition, by using the laminated structure according to the present embodiment, it is possible to provide a microscopic active matrix substrate at low cost.

Furthermore, by using the active matrix substrate according to the present embodiment, it is possible to provide a high-performance image display apparatus at low cost.

Practical examples are given below in order to explain the present invention more specifically.

PRACTICAL EXAMPLE 1

Figures 16A, 16B:
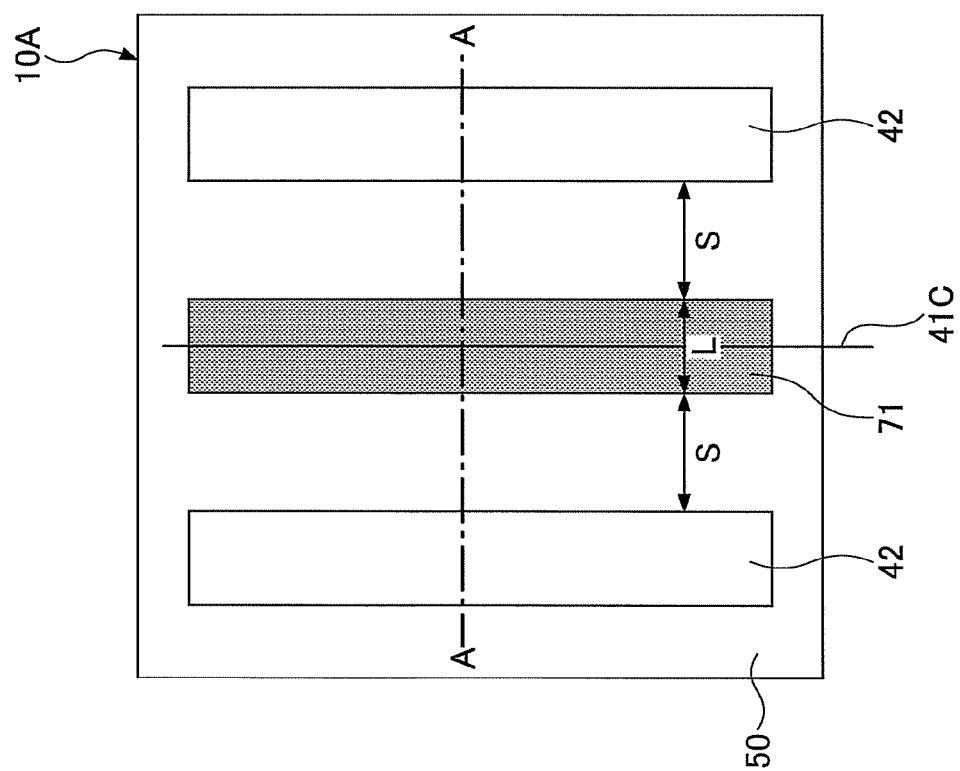
FIGS. 16A and 16B are drawings illustrating a method for manufacturing a laminated structure according to Practical Example 1.

Practical Example 1 relates to the method for manufacturing a laminated structure 10A shown in FIGS. 16A and 16B. FIGS. 16A and 16B illustrate the method for manufacturing the laminated structure 10A according to Practical Example 1. FIG. 16A is a plan view, and FIG. 16B is a cross-sectional diagram of FIG. 16A along line A-A.

First, an NMP solution containing a wettability variable material was applied to the glass substrate 20 by spin-coating. As the wettability variable material, a polyimide material expressed in the following chemical formula 1 was used. Next, the NMP solution was pre-calcined in an oven at 100° C., and then heat-treated in the oven at 300° C. to form the wettability variable layer 30.

of the functional fluid were about 30 mN/m and 10 mPa·s, respectively. The contact angles of the functional fluid with the high surface energy area and the low surface energy area measured using a drop method were about 5° and 30°, respectively. Droplets of the functional fluid were supplied using a piezo-inkjet head having one hundred nozzles, and the functional fluid jetted from the droplet discharge nozzles was <Chemical Formula 1>

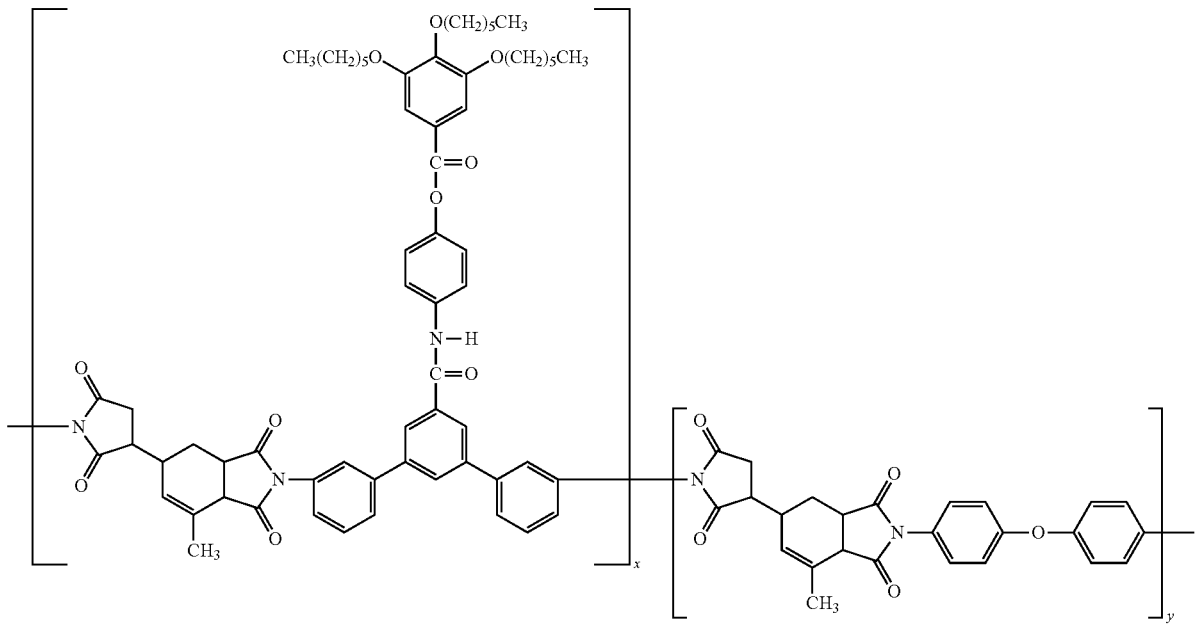

Subsequently, a photomask having multiple linear opening patterns was manufactured, and predetermined parts of the wettability variable layer 30 were exposed to ultraviolet light with a wavelength of 300 nm or less (using an ultra-high pressure mercury lamp) to form, in the surface region of the wettability variable layer 30, a pattern including the first region 41 and the second regions 42 of the high surface energy area and the low surface energy area 50. In the manufactured photomask, nine types of opening patterns, each of which had a different size, were provided in advance. Then, nine types of laminated structures were manufactured, each type of which had a different combination of the line width L of the first region 41 and a gap S between the first region 41 and the respective second regions 42.

Next, droplets of a functional fluid (the diameter of a travelling droplet, 25 μm; and the variation in the landing position, ±15 μm) were supplied to each pattern of the different combinations of the line width L and the gap S shown in Table 1 below. Note that some of the combinations shown in Table 1 satisfy Equation (1) while others do not; however, all the combinations satisfy Equation (2).

Specifically, a droplet of the functional fluid, which was a hydrophilic ink containing Ag nanoparticles, was selectively supplied only to the first region 41 of the high surface energy area by inkjet printing. The droplet center position was a center position 41C of the first region 41 (the line center of the first region 41), that is, X=0. The surface tension and viscosity controlled to have an average volume of about 8 pL (the diameter of a travelling droplet was about 25 μm) by adjusting the driving voltage of the inkjet head. A space between the substrate 20 and the droplet discharge nozzles was 0.5 mm, and the variation in landing position for all one hundred nozzles was ±15 μm.

After a droplet of the functional fluid was supplied to the first region 41, the functional fluid was dried and solidified in an oven at 100° C. to form the conductive layer 71, and herewith, the laminated structure 10A was manufactured.

The manufactured laminated structure 10A was examined using a metallurgical microscope to evaluate how the conductive layer 71 had been formed. The evaluation results are shown in Table 1. As shown in Table 1, in the case when both Equations (1) and (2) were satisfied (i.e., when a value in the column of Equation (1) in Table 1 is positive), the conductive layer 71 was formed only in the first region 41. In the case when Equation (2) was satisfied but Equation (1) was not satisfied (when a value in the column of Equation (1) in Table 1 is negative), the conductive layer 71 was also formed in the second regions 42. That is, it was confirmed that the conductive layer 71 was formed only in the first region 41 in a stable manner by satisfying both Equations (1) and (2). Note that, in Table 1, "○" denotes that the conductive layer 71 was formed only in the first region 41 while "×" denotes that the conductive layer 71 was formed also in the second regions 42.

TABLE 1

EXPERIMENTAL CONDITIONS

| DROPLET DIAMETER OF FUNCTIONAL FLUID D μm | VARIATION IN LANDING POSITION α μm | LINE WIDTH L μm | GAP S μm | DIAMETER OF DROPPING ALLOWABLE RANGE L + 2S μm | DISTANCE BETWEEN CENTER POSITION OF DROPLET AND CENTER POSITION OF FIRST REGION X μm | EQUATION (1) $(L + 2S - D - 2\alpha)/2 - X$ μm | RESULT OF EVALUATION BY OPTICAL MICROSCOPE |
|---|---|---|---|---|---|---|---|
| 25 | 15 | 80 | 15 | 110 | 0 | 27.5 | ○ |
| 25 | 15 | 80 | 10 | 100 | 0 | 22.5 | ○ |
| 25 | 15 | 80 | 5 | 90 | 0 | 17.5 | ○ |
| 25 | 15 | 40 | 15 | 70 | 0 | 7.5 | ○ |
| 25 | 15 | 40 | 10 | 60 | 0 | 2.5 | ○ |
| 25 | 15 | 40 | 5 | 50 | 0 | −2.5 | X |
| 25 | 15 | 30 | 15 | 60 | 0 | 2.5 | ○ |
| 25 | 15 | 30 | 10 | 50 | 0 | −2.5 | X |
| 25 | 15 | 30 | 5 | 40 | 0 | −7.5 | X |

PRACTICAL EXAMPLE 2

Practical Example 2 also relates to the method for manufacturing the laminated structure 10A shown in FIGS. 16A and 16B, as in the case of Practical Example 1.

For Practical Example 2, a photomask having linear opening patterns different from those of the photomask for Practical Example 1 was used, and the droplet center position was set to a point other than the center position 41C of the first region 41 (the line center of the first region 41), that is, X≠0. Other than these points, the laminated structure 10A of Practical Example 2 was formed in the same manner as that of Practical Example 1.

Droplets of the functional fluid (the diameter of a travelling droplet, 25 μm; and the variation in the landing position, ±15 μm) were supplied to each pattern of different combinations of the line width L and the gap S shown in Table 2 below to manufacture the laminated structure 10A. Then, the manufactured laminated structure 10A was examined using a metallurgical microscope to evaluate how the conductive layer 71 had been formed. The evaluation results are shown in Table 2. Note that all the combinations of the line width L and the gap S shown in Table 2 satisfy Equation (1); however, some of the combinations satisfy Equation (2) while others do not.

As shown in Table 2, in the case when both Equations (1) and (2) were satisfied (i.e., when a value in the column of Equation (2) in Table 2 is positive), the conductive layer 71 was formed only in the first region 41. In the case when Equation (1) was satisfied but Equation (2) was not satisfied (when a value in the column of Equation (2) in Table 2 is negative), the conductive layer 71 was formed also in the second regions 42. That is, it was confirmed that the conductive layer 71 was formed only in the first region 41 in a stable manner by satisfying both Equations (1) and (2). Note that, in Table 2, "○" denotes that the conductive layer 71 was formed only in the first region 41 while "x" denotes that the conductive layer 71 was formed also in the second regions 42.

TABLE 2

EXPERIMENTAL CONDITIONS

| DROPLET DIAMETER OF FUNCTIONAL FLUID D μm | VARIATION IN LANDING POSITION α μm | LINE WIDTH L μm | GAP S μm | DIAMETER OF DROPPING ALLOWABLE RANGE L + 2S μm | DISTANCE BETWEEN CENTER POSITION OF DROPLET AND CENTER POSITION OF FIRST REGION X μm | EQUATION (2) $(L + D - 2\alpha)/2 - X$ μm | RESULT OF EVALUATION BY OPTICAL MICROSCOPE |
|---|---|---|---|---|---|---|---|
| 25 | 15 | 80 | 80 | 130 | 0 | 37.5 | ○ |
| 25 | 15 | 80 | 80 | 130 | 10 | 27.5 | ○ |
| 25 | 15 | 80 | 80 | 130 | 20 | 17.5 | ○ |
| 25 | 15 | 40 | 40 | 90 | 0 | 17.5 | ○ |
| 25 | 15 | 40 | 40 | 90 | 10 | 7.5 | ○ |
| 25 | 15 | 40 | 40 | 90 | 20 | −2.5 | X |
| 25 | 15 | 30 | 30 | 80 | 0 | 12.5 | ○ |
| 25 | 15 | 30 | 30 | 80 | 10 | 2.5 | ○ |
| 25 | 15 | 30 | 30 | 80 | 20 | −7.5 | X |

PRACTICAL EXAMPLE 3

Figures 17A, 17B:
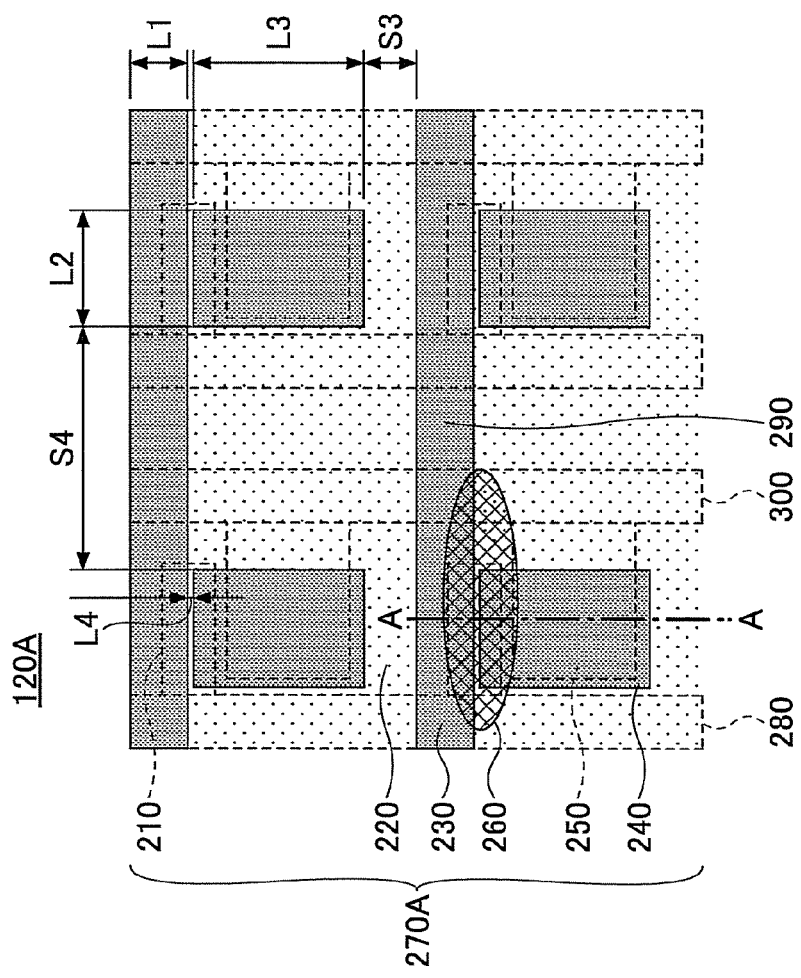
FIGS. 17A and 17B are drawings illustrating an active matrix substrate according to Practical Example 3.

Practical Example 3 relates to a method for manufacturing an active matrix substrate 120A shown in FIGS. 17A and 17B. FIGS. 17A and 17B illustrate the method for manufacturing the active matrix substrate 120A according to Practical Example 3. FIG. 17A is a plan view, and FIG. 17B is a cross-sectional diagram of FIG. 17A along line A-A.

The active matrix substrate 120A has a transistor 270A, which is a replacement of the transistor 270 of the active matrix substrate 120 shown in FIGS. 11A and 11B. The transistor 270A differs from the transistor 270 by not having the wettability variable layer 200. That is, in the transistor 270A, the gate electrode 210, the capacitor electrode 250 and the common signal line 300 are formed directly on the substrate 20.

FIG. 17A shows a structural example of four pixels of the active matrix substrate 120A; however, in practice, the active matrix substrates 120A included a 200×200 pixel matrix containing in total of 40000 pixels.

Sizes of individual parts are as follows. The pixel size corresponds to 160 PPI and is about 159 μm. The diameter D of a travelling droplet of the functional fluid is about 25 μm; the variation a in the landing position, ±15 μm; a line width L1 of the source electrode 230 is 40 μm; a horizontal width L2 and a vertical width L3 of the drain electrode 240 are 65 μm and 89 μm, respectively; a channel length L4 expressed as a gap between the source electrode 230 and the drain electrode 240 is 5 μm; a gap S3 between the source electrode 230 and the drain electrode 240 is 25 μm; and a gap S4 between adjacent drain electrodes 240 is 94 μm.

The method for manufacturing the active matrix substrate 120A is described below; however, since the conditions related to the polyimide material, the functional fluid and the droplet supply of the functional fluid remain the same as those for Practical Example 1, the detailed descriptions are omitted herein.

The gate electrode 210, the capacitor electrode 250, the gate signal line 280 and the common signal line 300 were formed by photolithography on the substrate 20, which is a glass substrate. Next, an NMP solution containing a polyimide material was applied to the substrate 20 by spin-coating. The NMP solution was pre-calcined in an oven at 100° C., and then heat-treated in the oven at 300° C. to form the wettability variable layer 220. Subsequently, parts of the wettability variable layer 220 were exposed to ultraviolet light using a photomask having a predetermined pattern to thereby form, in the surface region of the wettability variable layer 220, a pattern having the high surface energy areas 221 and the low surface energy areas 222.

Next, droplets of the functional fluid were selectively supplied to the high surface energy areas 221 and heat-treated to form the source electrode 230, the drain electrode 240 and the source signal line 290.

Then, a liquid solution, in which an organic semiconductor polymer created in a synthesis represented by the following chemical formula 2 was dissolved in toluene, was applied by inkjet printing to form the semiconductor layer 260, and herewith, the active matrix substrate 120A was completed.

<Chemical Formula 2>

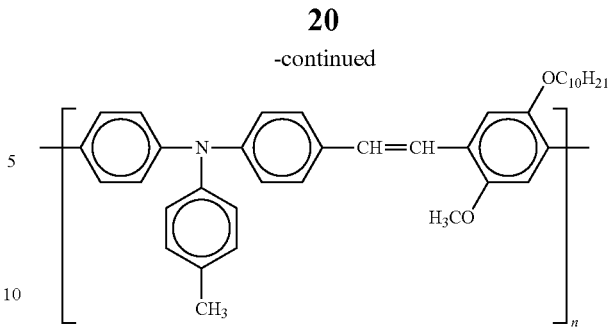

Figure 18:
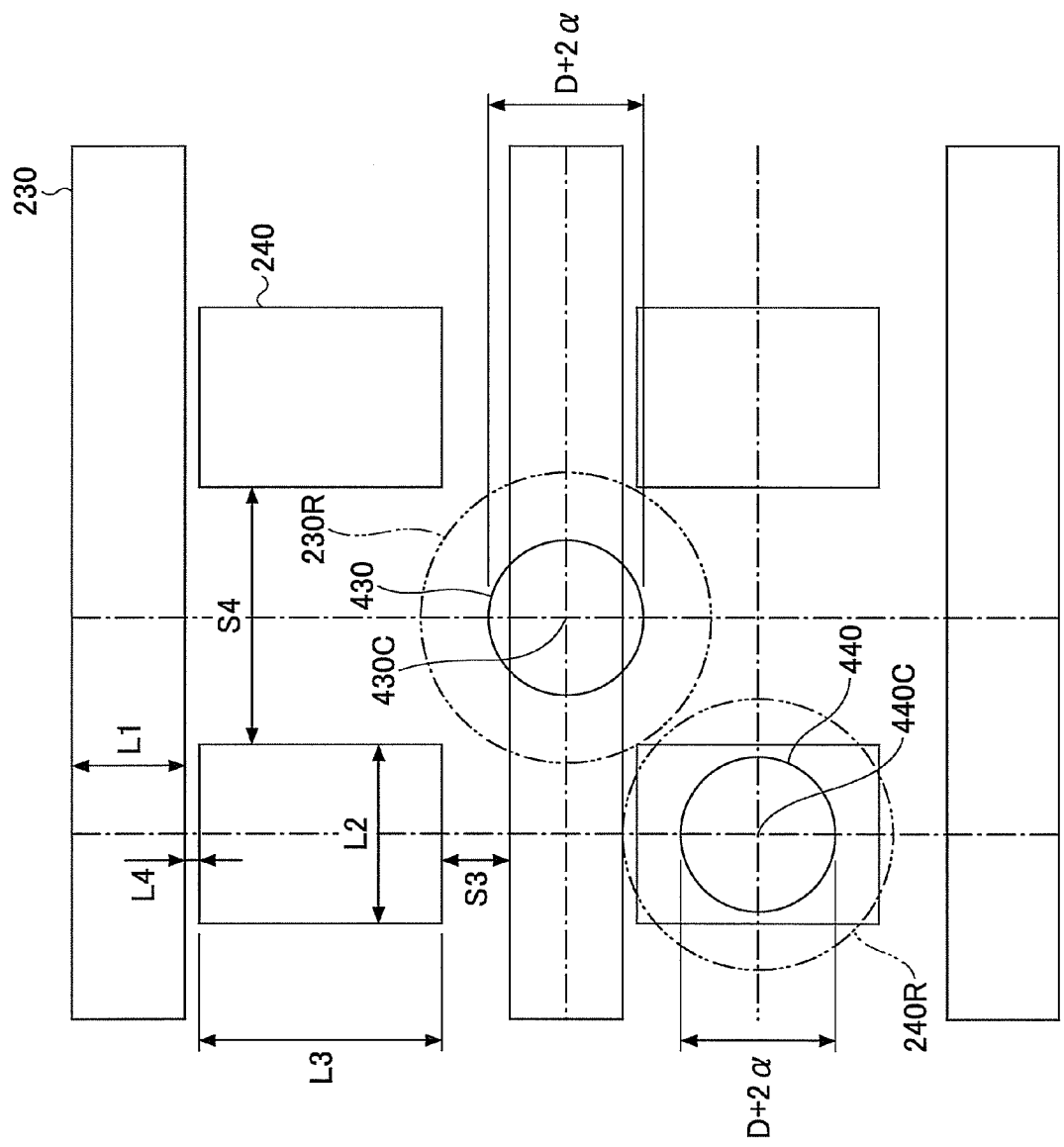
FIG. 18 is a drawing illustrating a supply arrangement example of the function fluid according to Practical Example 3.

FIG. 18 illustrates a supply arrangement example of the functional fluid used for forming the source electrode 230, the drain electrode 240 and the source signal line 290 according to Practical Example 3. Based on the sizes of the individual parts of FIG. 17A, the following values are obtained: [the diameter D of the dropping range of the functional fluid 61]+2α=55 μm; the diameter of the dropping allowable range 240R of the drain electrode 240 =L3+2×L4=99 μm; and the diameter of the dropping allowable range 230R of the source electrode $230=2\times\sqrt{\{(L1/2+L4)^2+(S4/2)^2\}}=106$ μm.

As shown in FIG. 18, a droplet center position 430C of the functional fluid 61 was arranged in such a manner that a dropping range 430 of the functional fluid 61 was positioned within the dropping allowable range 230R (the diameter=106 μm) of the source electrode 230. Also, a droplet center position 440C of the functional fluid 61 was arranged in such a manner that a dropping range 440 of the functional fluid 61 was positioned within the dropping allowable range 240R (the diameter=99 μm) of the drain electrode 240.

More specifically, the droplet center position 430C of the functional fluid 61 for the formation of the source electrode 230 was positioned on the line center of the source electrode 230, and a droplet of the functional fluid 61 was supplied every 159 μm in the formation of the source electrode 230. Also, the droplet center position 440C of the functional fluid 61 for the formation of the drain electrode 240 was set to the center of gravity of the drain electrode 240, and a droplet of the functional fluid 61 was supplied for each drain electrode 240 in the formation of the drain electrode 240. Thus, determining the dropping positions of the functional fluid 61 allowed stable formation of microscopic electrodes having a line width L1 of 40 μm and a channel length L4 of 5 μm.

PRACTICAL EXAMPLE 4

In Practical Example 4, a display apparatus was manufactured by attaching an electrophoresis device to the active matrix substrate 120A manufactured in Practical Example 3. As for the electrophoresis device, an application liquid made by mixing microcapsules, which include titanium oxide particles and Isoper dyed with Oil Blue, and a PVA (polyvinyl alcohol) aqueous solution was applied to a polycarbonate substrate having a transparent electrode made of ITO, to thereby form a layer including the microcapsules and a PVA binder. When the display apparatus formed by disposing the substrate and the active matrix substrate one above the other was operated, images with high contrast were achieved. In addition, by using the high-definition active matrix substrate 120A with 160 PPI, it was possible to display 10 pt letters clearly.

According to the technology disclosed in this specification, it is possible to provide a laminated structure having a microscopic conductive layer formed by inkjet printing, a multilayer wiring board, an active matrix substrate, an image display apparatus and a method for manufacturing the laminated structure.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a laminated structure including a wettability variable layer that contains a wettability variable material whose surface energy changes when energy is applied thereto and includes at least a high surface energy area having high surface energy and a low surface energy area having low surface energy, and a conductive layer disposed on the high surface energy area, the method comprising:

a first step of forming the wettability variable layer containing the wettability variable material;

a second step of applying the energy to parts of the wettability variable layer and thereby forming the high surface energy area including a first region and a second region adjacent to each other and separated by the low surface energy area therebetween and having higher surface energy than the low surface energy area;

a third step of supplying a droplet of a functional fluid containing a conductive material selectively to at least the first region; and a fourth step of drying the supplied functional fluid and thereby forming, on the high surface energy area, the conductive layer including the conductive material, wherein in the third step, the droplet of the functional fluid is supplied by inkjet printing, and a center position of the supplied droplet is determined in such a manner as to satisfy both Equation (1) and Equation (2), where $$X < \pm (L+2S-D-2\alpha)/2 \text{ (here, } L+2S > D+2\alpha\text{) is} \quad \text{Equation (1); and}$$

$$X < \pm (L+D-2\alpha)/2 \text{ (here, } L+2D > D+2\alpha\text{) is} \quad \text{Equation (2);}$$

wherein X is a distance between a center position of the first region and the center position of the droplet, D is a diameter of the droplet when travelling, $\alpha$ is variation in a landing position of the droplet, L is width of the first region, and S is a gap between the first and the second regions.

2. The method as claimed in claim 1, wherein in the third step, the conductive layer is formed in both the first and the second regions by supplying droplets of the functional fluid to the first and the second regions with separation therebetween in such a manner that dropping ranges of the droplets do not overlap with one another.

3. The method as claimed in claim 2, wherein in the third step, the droplets are supplied in such a manner that center positions of the droplets are in a staggered pattern.

4. The method as claimed in claim 3, wherein a contact angle of the functional fluid with the low surface energy area is 30° or more and a contact angle of the functional fluid with the high surface energy area is 5° or less.

5. The method as claimed in claim 2, wherein a contact angle of the functional fluid with the low surface energy area is 30° or more and a contact angle of the functional fluid with the high surface energy area is 5° or less.

6. The method as claimed in claim 1, wherein a contact angle of the functional fluid with the low surface energy area is 30° or more and a contact angle of the functional fluid with the high surface energy area is 5° or less.

* * * * *